United States Patent
Kim et al.

(10) Patent No.: US 9,128,332 B2
(45) Date of Patent: Sep. 8, 2015

(54) LIQUID CRYSTAL LENS PANEL AND DISPLAY APPARATUS HAVING THE SAME

(75) Inventors: Kyung-Bae Kim, Yongin-si (KR); Hae-Young Yun, Suwon-si (KR); KyungHo Jung, Bundang-gu (KR); Seung Jun Jeong, Hwaseong-si (KR); Jin-Hwan Kim, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 476 days.

(21) Appl. No.: 13/528,577

(22) Filed: Jun. 20, 2012

(65) Prior Publication Data

US 2013/0208196 A1   Aug. 15, 2013

(30) Foreign Application Priority Data

Feb. 9, 2012   (KR) .................. 10-2012-0013429

(51) Int. Cl.
| | | |
|---|---|---|
| *G02F 1/1335* | (2006.01) | |
| *G02F 1/1343* | (2006.01) | |
| *G02F 1/29* | (2006.01) | |
| *G02B 27/22* | (2006.01) | |

(52) U.S. Cl.
CPC ........ *G02F 1/134309* (2013.01); *G02B 27/225* (2013.01); *G02B 27/2214* (2013.01); *G02F 1/29* (2013.01)

(58) Field of Classification Search
CPC .. G02B 27/2214; G02F 1/29; G02F 2001/294
USPC .................................. 349/15, 200
See application file for complete search history.

(56) References Cited

U.S. PATENT DOCUMENTS

| | | | |
|---|---|---|---|
| 7,453,529 B2 | 11/2008 | Nam et al. | |
| 7,697,109 B2 | 4/2010 | Yun et al. | |
| 7,714,946 B2 | 5/2010 | Hong et al. | |
| 7,969,517 B2 | 6/2011 | Jung | |
| 2005/0073472 A1 | 4/2005 | Kim et al. | |
| 2008/0252720 A1 | 10/2008 | Kim et al. | |
| 2010/0157181 A1 | 6/2010 | Takahashi | |
| 2010/0302490 A1 | 12/2010 | Chiu | |
| 2011/0032438 A1* | 2/2011 | Yun et al. ................. 349/15 |

(Continued)

FOREIGN PATENT DOCUMENTS

| | | |
|---|---|---|
| JP | 2010-164852 | 7/2010 |
| KR | 1020070070327 | 7/2007 |

(Continued)

*Primary Examiner* — Thanh-Nhan P Nguyen
(74) *Attorney, Agent, or Firm* — H.C. Parks & Associates, PLC

(57) ABSTRACT

A liquid crystal lens panel includes a first substrate, a second substrate, and a liquid crystal layer disposed between the first substrate and the second substrate. The first substrate includes a first base substrate and a plurality of first electrodes disposed on the first base substrate. The second substrate includes a second base substrate disposed to face the first base substrate, the second substrate further including a plurality of second electrodes disposed on the second base substrate. Each of the first base substrate and the second base substrate are rectilinearly shaped to comprise corresponding first sides and second sides, the plurality of first electrodes and the plurality of second electrodes are inclined with respect to the corresponding first sides or second sides, and the plurality of first electrodes comprise a first inclination angle different from a second inclination angle associated with the plurality of second electrodes.

38 Claims, 12 Drawing Sheets

(56) References Cited

U.S. PATENT DOCUMENTS

| | | |
|---|---|---|
| 2011/0084961 A1 | 4/2011 | Son et al. |
| 2011/0128456 A1 | 6/2011 | Son |
| 2011/0157496 A1 | 6/2011 | Im |
| 2011/0157497 A1* | 6/2011 | Kim ................................ 349/15 |
| 2011/0157498 A1 | 6/2011 | Kim et al. |

FOREIGN PATENT DOCUMENTS

| | | |
|---|---|---|
| KR | 1020080048331 | 6/2008 |
| KR | 1020090006472 | 1/2009 |
| KR | 1020090021425 | 3/2009 |
| KR | 1020090089611 | 8/2009 |
| KR | 1020110104701 | 9/2011 |

* cited by examiner

<2D Mode>

<3D Mode>

LIQUID CRYSTAL LENS PANEL AND DISPLAY APPARATUS HAVING THE SAME

CROSS-REFERENCE TO RELATED APPLICATION

This application claims priority from and the benefit of Korean Patent Application No. 10-2012-0013429, filed on Feb. 9, 2012, which is incorporated by reference for all purposes as if fully set forth herein.

BACKGROUND

1. Field of Disclosure

The present disclosure relates to display technologies, and more particularly to autostereoscopic display technologies.

2. Discussion

Conventional stereoscopic display technologies create (or otherwise enhance) the illusion of depth by presenting offset images exhibiting a binocular disparity to respective left eyes and right eyes of viewers. In this manner, respective two-dimensional (2D) retinal images may be perceived by the left-eye and right-eye of a viewer, such that the respective 2D retinal images may be autonomically combined to create the perception of a three-dimensional (3D) image.

Traditionally, stereoscopic display technologies have mechanically presented the 2D images to viewers, such that the viewers are required to utilize headgear, such as polarizing glasses, to either combine separate 2D images from two offset sources or to separate a left-eye image and a right-eye image from a single source. While certainly effective, such requirements may leave viewers feeling inconvenienced by the necessity to wear such polarizing glasses or any "other" headgear.

Therefore, there is a need for an approach that provides effective, cost-efficient autostereoscopic display technologies, capable of respectively presenting images directionally to the left eye and right eye of a viewer, such that the viewer is not necessarily required to wear any polarizing glasses or any "other" headgear to benefit from the binocular perception of depth.

SUMMARY

Various exemplary embodiments provide effective, cost-efficient autostereoscopic display technologies configured to not only improve display quality, but also capable of respectively presenting images directionally to the left eye and the right eye of a viewer, such that the viewer is not necessarily required to wear any polarizing glasses or any "other" headgear to perceive the illusion of depth.

Other exemplary embodiments provide effective, cost-efficient autostereoscopic display technologies configured to prevent the occurrence of undesirable optical noise, such as the development of extraneous (or otherwise unwanted) moiré fringe patterns.

Additional, as well as other features will be set forth in the detailed description which follows and, in part, will be apparent to those having ordinary skill in the art upon examination of the following or may be learned from the practice of the disclosed exemplary embodiments. As such, various advantages and/or features of the disclosed exemplary embodiments may be realized and obtained as particularly pointed out in the appended claims.

According to one exemplary embodiment, a liquid crystal lens panel includes: a first substrate having a first base substrate and a plurality of first electrodes disposed on the first base substrate; a second substrate including a second base substrate disposed to face the first base substrate, the second substrate further having a plurality of second electrodes disposed on the second base substrate; and a liquid crystal layer disposed between the first substrate and the second substrate. Each of the first base substrate and the second base substrate are rectilinearly shaped to include corresponding first sides and second sides, the plurality of first electrodes and the plurality of second electrodes are inclined with respect to the corresponding first sides or second sides, and the plurality of first electrodes have a first inclination angle different from a second inclination angle associated with the plurality of second electrodes.

According to another exemplary embodiment, a display apparatus includes: a display panel including a plurality of pixels and a light blocking pattern disposed to separate respective pixels; and a liquid crystal lens panel disposed in an image-emitting direction, the liquid crystal lens panel being configured to refract incident source illumination and including a plurality of lens parts having a central lens axis, the liquid crystal lens panel further including: a first substrate having a first base substrate and a plurality of first electrodes disposed on the first base substrate, a second substrate including a second base substrate disposed to face the first base substrate, the second substrate further having a plurality of second electrodes disposed on the second base substrate, and a liquid crystal layer disposed between the first substrate and the second substrate. Each of the first base substrate and the second base substrate are rectilinearly shaped to include corresponding first sides and second sides, the plurality of first electrodes and the plurality of second electrodes are inclined with respect to the corresponding first sides or second sides, and the plurality of first electrodes include a first inclination angle different from a second inclination angle associated with the plurality of second electrodes.

According to a further exemplary embodiment, a display apparatus includes: a display panel including a first side and a second side, the display panel being configured to present a left-eye image and a right-eye image; and a liquid crystal lens panel disposed in an image-emitting direction, and configured to refract incident light and including a plurality of lens parts having a controllable lens axis. The plurality of lens parts include, in association with presentation of the left-eye image, a first inclination angle inclined with respect to one of the first and second sides and have, in association with presentation of the right-eye image, a second inclination angle inclined with respect to one of the first and second sides.

According to other exemplary embodiments, a method includes: causing, at least in part, presentation of a left-eye image or a right-eye image; and causing, at least in part, liquid crystal molecules to be spatially configured and variably aligned in association with either presentation of the left-eye image or presentation of the right-eye image, wherein spatial configuration and variable alignment of the liquid crystal molecules is configured to form one or more Fresnel lens parts. Iterative presentation of the left-eye image and the right-eye image is configured to automatically convey the illusion of depth in association with a perceived image.

According to yet other exemplary embodiments, an apparatus includes: a display panel configured to present an image in association with a presentation surface; and a variable lens panel disposed to receive source illumination from the display panel, the variable lens panel including liquid crystal molecules, the variable lens panel being configured to manipulate the liquid crystal molecules via imposition of a non-uniform electric flux to vary at least one refractive index associated with the liquid crystal molecules, the imposition of the non-uniform electric flux being configured to orient the liquid crystal molecules to form one or more Fresnel lens parts based on a plurality of operating modes associated with the variable lens panel. A three-dimensional image is selectively presented based on an operating mode associated with the apparatus and the plurality of operating modes associated with the variable lens panel.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate various exemplary embodiments of the invention, and together with the description serve to explain principles of the invention.

DETAILED DESCRIPTION

Figure 1:
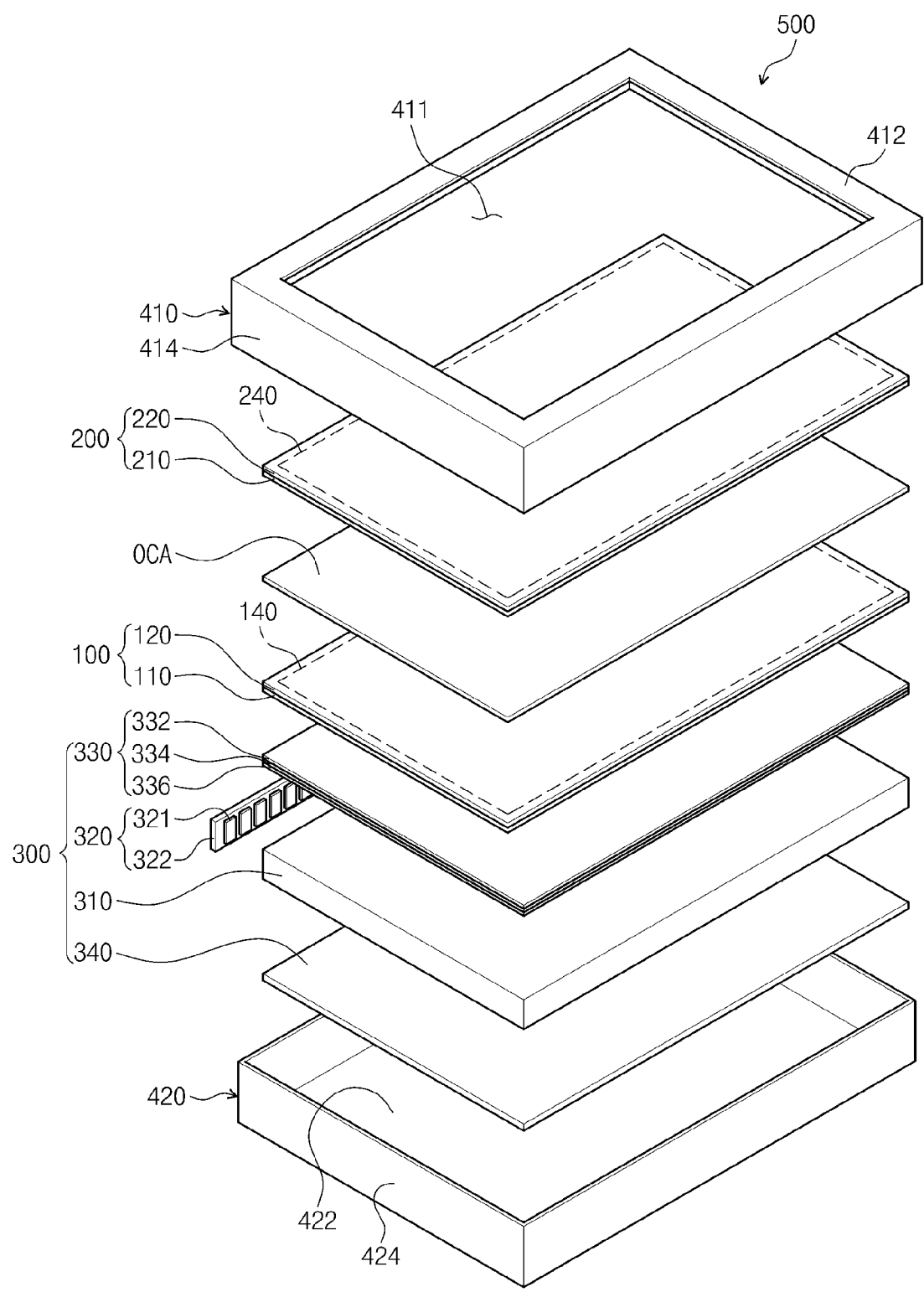
FIG. 1 is an exploded perspective view of an autostereoscopic display apparatus, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers and/or regions may be exaggerated for clarity and descriptive purposes. Also, like reference numerals denote like elements.

When an element or layer is referred to as being "on" or "connected to" another element or layer, it may be directly on or directly connected to the other element or layer, or intervening elements or layers may be present. When, however, an element is referred to as being "directly on" or "directly connected to" another element or layer, there are no intervening elements or layers present. For the purposes of this disclosure, "at least one of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by the use of these terms. These terms are only used to distinguish one element, component, region, layer or section from another element, component, region, layer or section. Thus, a first element, component, region, layer or section that is discussed below could be termed a second, third, etc., element, component, region, layer or section without departing from the teachings of the present invention.

Spatially relative terms, such as "beneath", "below", "lower", "above", "upper" and the like, may be used herein for descriptive purposes and, thereby, to describe one element or feature's relationship to another element(s) or feature(s) as illustrated in the drawings. It will be understood that spatially relative terms are intended to encompass different orientations of an apparatus in use and/or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations) and, as such, the spatially relative descriptors used herein are to be interpreted accordingly.

The terminology used herein is for the purpose of describing particular embodiments only and is not intended to be limiting. As used herein, the singular forms "a", "an" and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense unless expressly defined as such herein.

Figure 2:
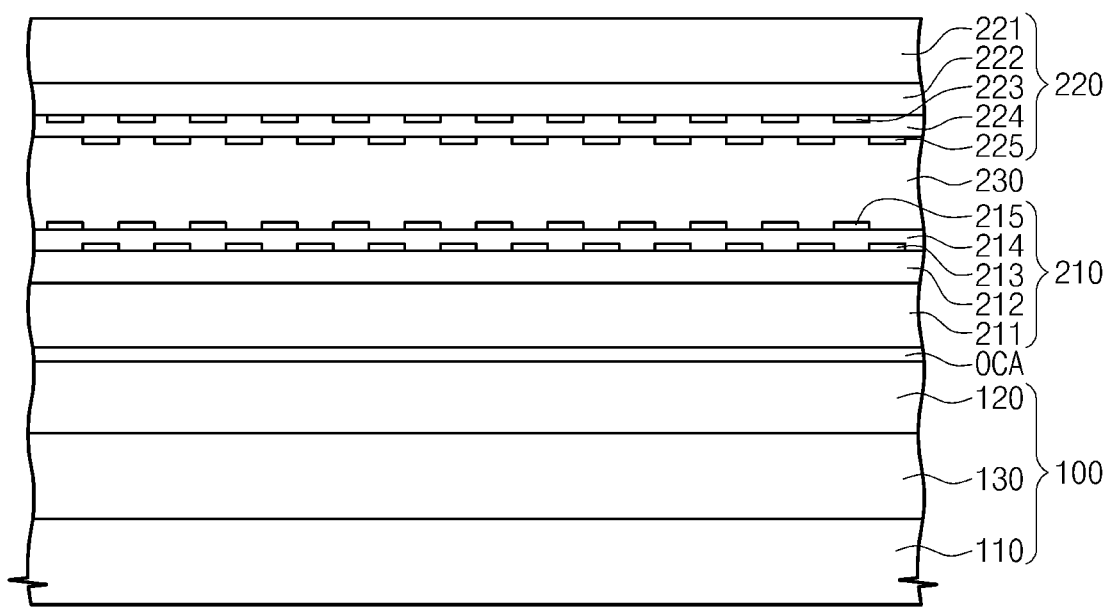
FIG. 2 is a sectional view of a portion of a display panel and a liquid crystal lens panel of the autostereoscopic display apparatus of FIG. 1, according to an exemplary embodiment.

FIG. 1 is an exploded perspective view of an autostereoscopic display apparatus, according to an exemplary embodiment. FIG. 2 is a sectional view of a portion of a display panel and a liquid crystal lens panel of the autostereoscopic display apparatus of FIG. 1.

As seen in the illustrated exemplary embodiment, autostereoscopic display apparatus (or display apparatus) 500 may include one or more components, such as display panel 100, liquid crystal lens panel 200, backlight unit 300, upper cover 410, and lower cover 420.

Display panel 100 may comprise (or otherwise implement) various display panel technologies, such as various self-emissive and/or non-self-emissive display panel technologies. For instance, self-emissive display panels may include organic light emitting display (OLED) panels, plasma display panels (PDP), etc., whereas non-self-emissive display panels may constitute liquid crystal display (LCD) panels, electrophoretic display (EPD) panels, electrowetting display (EWD) panels, and/or the like. According to the illustrated exemplary embodiment, display panel 100 comprises a non-self-emissive display panel. In this manner, display apparatus 500 may be further configured to include one or more backlight units, such as backlight unit 300, configured to illuminate (or otherwise radiate source illumination towards) display panel 100. For the sake of brevity, display apparatus 500 will, hereinafter, be considered as including a non-self-emissive display panel, but as previously mentioned, various exemplary embodiments are not limited thereto.

According to various exemplary embodiments, display panel 100 may be geometrically configured to include, for example, a rectangular display surface including first sides and second sides, as well as exhibiting display area 140 configured to present image(s) to one or more viewers. In this particular illustrative example, the first sides or the second sides may be longer than the respective other sides. It is contemplated; however, that display panel 100 may be alternatively (or additionally) configured to include, for instance, a circular, ovular or any other suitable polygonal display surface. Additionally, display panel 100 may include array substrate 110, opposite substrate 120 disposed to face array substrate 110, and first liquid crystal layer 130 disposed between array substrate 110 and opposite substrate 120.

Array substrate 110 may, in certain exemplary embodiments, include a plurality of pixels (not shown), which may be spatially positioned (or otherwise arranged) according to one or more configurations, such as according to a matrix configuration. For instance, the plurality of pixels may be uniformly positioned and, thereby, spaced in one or more row and column formations. It is contemplated, however, that the spatial positioning and/or spacing between pixels may be varied or randomly disposed. In any instance, however, one or more light blocking layers (not illustrated) may be disposed between pixels to prevent optical interference (or other undesirable optical phenomena) associated with source illumination (e.g., visible light) radiating through or form one or more of the plurality of pixels. It is noted that the inclusion and configuration of one or more light blocking layers may improve a contrast ratio associated with display panel 100.

While not depicted, individual pixels may include (or be electrically connected to) a gate line(s) configured to extend in at least one first direction, which may be parallel (or substantially parallel) to at least one side of array substrate 110. Furthermore, individual pixels may include (or be electrically connected to) one or more data lines (not shown) configured to extend in at least one second direction, which may be perpendicular (or substantially perpendicular) to the first direction, as well as one or more pixel electrodes (not illustrated). In this manner, individual pixels may also include one or more thin film transistors (not shown) that are configured to electrically connect to the gate line(s), the data line(s), and/or the pixel electrode(s). It is contemplated that the thin film transistor(s) may be utilized to switch one or more driving signals associated with (e.g., applied to) corresponding pixel electrodes.

While not shown, at least one driver, e.g., integrated circuit (IC), may be disposed adjacent to at least one side of array substrate 110. In this manner, the at least one driver may be configured to receive various control signals from, for instance, one or more external devices or image sources (not shown), as well as configured to transmit (or otherwise supply) at least one driving signal to corresponding thin film transistors in response to the various control signals. As such, the at least one driver may be configured to drive display panel 100 to present one or more images to one or more viewers.

Opposite substrate 120 may include one or more color filters (not shown), such as one or more red, green, blue (RGB) color filters, configured to modify at least one wavelength (e.g., color) of light radiating from, for example, backlight unit 300. It is further contemplated that one or more common electrodes (not shown) may be disposed on the color filter(s), and may be further disposed to face the pixel electrode(s). The color filter(s) may be manufactured via any suitable process, such as, for example, via a thin film manufacturing process. According to one exemplary embodiment, a plurality of color filters may be disposed on opposite substrate 120; however, it is contemplated that the plurality of color filters may be additionally or alternatively disposed. For instance, the color filters may be disposed on array substrate 110, etc.

First liquid crystal layer 130 may, according to certain exemplary embodiments, include liquid crystal molecules, which may be spatially arranged and/or orientated in one or more directions based on the imposition of at least one electric field. That is, the spatial arrangement and/or orientation of liquid crystal molecules may be controlled via respective application of one or more voltages to the above-noted pixel electrode(s) and/or common electrode(s). In this manner, first liquid crystal layer 130 may be configured to effect transmittance of light radiating from backlight unit 300 towards display panel 100 so as to facilitate the presentation (e.g., display) of one or more images.

According to various exemplary embodiments, liquid crystal lens panel 200 may be disposed closer to at least one viewer than backlight unit 300 and, thereby, disposed in at least one "positive" image-emitting direction associated with display panel 100. In this manner, liquid crystal lens panel 200 may be configured to separate an image displayed via display panel 100, such as configured to separate the image into a left-eye image and a right-eye image. Transmission area 240 of liquid crystal lens panel 200 may be configured (e.g., similarly shaped) to correspond to display area 140. It is contemplated, however, that transmission area 240 may be alternatively configured to form any suitable geometric surface, whether or not corresponding to display area 140. Accordingly, liquid crystal lens panel 200 may be further configured to include first substrate 210, second substrate 220 disposed to face first substrate 210, and second liquid crystal layer 230 disposed between first substrate 210 and second substrate 220.

First substrate 210 may, in certain exemplary embodiments, include first base substrate 211, a plurality of first electrodes 213 disposed on first base substrate 211, first insulating layer 214 disposed on and to cover the plurality of first electrodes 213, and a plurality of second electrodes 215 disposed on first insulating layer 214. In one exemplary embodiment, the respective pluralities of first electrodes 213 and second electrodes 215 may be configured in accordance with one or more "stripe" patterns, as will become more apparent below. It is contemplated; however, that the respective pluralities of first electrodes 213 and second electrodes 215 may be additionally and/or alternatively configured, such as in accordance with a particular display apparatus configuration or application. In any event, second insulating layer 212 may be disposed between first base substrate 211 and the plurality of first electrodes 213.

Second substrate 220 may, according to various exemplary embodiments, include second base substrate 221, a plurality of third electrodes 223 disposed on second base substrate 221, third insulating layer 224 disposed on and to cover the plurality of third electrodes 223, and a plurality of fourth electrodes 225 disposed on third insulating layer 224. As with the respective pluralities of first electrodes 213 and second electrodes 215, the respective pluralities of third electrodes 223 and fourth electrodes 225 may be configured in accordance with one or more similar or other "stripe" patterns, as will also become more apparent below. It is contemplated; however, that the respective pluralities of third electrodes 223 and fourth electrodes 225 may be additionally and/or alternatively configured, such as in accordance with a particular display apparatus configuration or application. Fourth insulating layer 222 may, based on one or more exemplary embodiments, be disposed between second base substrate 221 and the plurality of third electrodes 223.

According to various exemplary embodiments, display panel 100 and liquid crystal lens panel 200 may be coupled or otherwise connected. For instance, at least one optically clear adhesive (OCA) may be disposed between display panel 100 and liquid crystal lens panel 200 to couple or otherwise connect display panel 100 and liquid crystal lens panel 200. It is contemplated; however, that any other suitable mechanism(s) may be utilized, such as one or more chemical, mechanical, thermal, etc., mechanisms, and/or one or more combinations thereof.

In those exemplary embodiments including backlight unit 300, backlight unit 300 may be disposed farther away from at least one viewer than liquid crystal lens panel 200 and, thereby, disposed in at least one "negative" image-emitting direction associated with display panel 100. Accordingly, backlight unit 300 may be configured to include one or more components, such as, for example, light guide plate 310, light source part (or assembly) 320 including one or more light source components, optical member 330, and reflective sheet 340.

Light guide plate 310 may be disposed farther away from at least one viewer than display panel 100 (e.g., under display panel 100) and, thereby, disposed in the at least one "negative" image-emitting direction. In this manner, light guide plate 310 may be configured to guide (or otherwise redirect) source illumination radiating from light source part 320 to be incident upon display panel 100. According to various exemplary embodiments, light guide plate 310 may be configured in accordance with a configuration of display area 140 associated with display panel 100, such that, for example, light guide plate "overlaps" at least a portion of display area 140. It is contemplated; however, that light guide plate 310 may be additionally or alternatively configured. In any event, light guide plate 310, according to the illustrated exemplary embodiment, may include an exit surface from which source illumination is radiated or otherwise emitted, a lower surface disposed to face the exit surface, and one or more side surfaces disposed to interface with the exit surface and the lower surface. At least one of the side surfaces may, according to various exemplary embodiments, be an incident surface disposed to face light source part 320 and, thereby, configured to receive source illumination from light source part 320. One or more of the side surfaces disposed to face the incident surface may be reflective surfaces configured to reflect (or otherwise redirect) source illumination from light source part 320 or source illumination from light source part 320 and that has been redirected one or more times by another surface, e.g., another reflective surface.

As seen in the illustrated exemplary embodiment, light source part 320 may be configured to include a plurality of light sources 321. It is contemplated, however, that light source part 320 may be configured to include as little as one light source (which may constitute one light source 321 or another suitable light source) or as many light sources (which, again, may constitute one or more light sources 321 and/or one or more other suitable light sources) as are capable of being configured in association with light source part 320. In any event, the light sources, such as light sources 321, may constitute a plurality of light emitting diodes disposed on at least one printed circuit board (PCB), such as PCB 322. Additionally, light source part 320 may be disposed to face at least one of the aforementioned side surfaces associated with light guide plate 320. In this manner, light source part 320 may be configured to radiate source illumination (e.g., light) at least towards display panel 100 via light guide plate 310.

Optical member 330 may be disposed between light guide plate 310 and display panel 100. In various exemplary embodiments, optical member 330 is configured to control source illumination radiated (or otherwise emitted) from light source part 320 and, thereby, radiated from light guide plate 310. Optical member 330 may additionally include diffusion sheet 336, prism sheet 334, and protective sheet 332 among one or more other or alternative components.

According to various exemplary embodiments, diffusion sheet 336 is configured to diffuse source illumination radiating from light guide plate 310. In this manner, prism sheet 334 may be configured to condense such diffused source illumination radiating from diffusion sheet 336. As such, the condensed, diffused source illumination may be normally (or substantially normally) incident upon the lower surface of display panel 100. For instance, such illumination may be configured to propagate from backlight unit 300 toward liquid crystal lens panel 200 as seen in, for example, FIGS. 9 and 12, as will become more apparent below. Accordingly, source illumination radiating from prism sheet 334 may be normally (or substantially normally) incident upon display panel 100. Further, protective sheet 332 may be disposed on prism sheet 334, so as to protect prism sheet 334 from, for instance, ambient conditions, external impacts, and/or the like.

While the illustrated exemplary embodiment depicts optical member 330 as including diffusion sheet 336, prism sheet 334, and protective sheet 332, it is contemplated that various other exemplary embodiments of display apparatus 500 may be additionally or alternatively configured. For instance, optical member 330 may include multiple ones of at least one of diffusion sheet 336, prism sheet 334, and protective sheet 332; may be configured to omit at least one of diffusion sheet 336, prism sheet 334, and protective sheet 332; or at least one of diffusion sheet 336, prism sheet 334, and protective sheet 332 may be configure as part of one or more other components of display apparatus 500, as well as any combination thereof.

According to various exemplary embodiments, reflective sheet 340 may be disposed farther away from at least one viewer than light guide plate 310 and, thereby, disposed in the at least one "negative" image-emitting direction associated with display panel 100. As such, reflective sheet 340 may be configured to reflect source illumination radiating from light guide plate 310 and propagating in at least one direction "away from" display panel 100. Reflective sheet 340 may, therefore, include at least one material capable of reflecting incident illumination. In certain exemplary embodiments, reflective sheet 340 may be disposed on lower cover 420 and, thereby, configured to reflect (or otherwise redirect) source illumination radiating from light source part 320 towards lower cover 420. As a result, reflective sheet 340 may increase the light extraction efficiency associated with backlight unit 300.

With continued reference to FIG. 1, upper cover 410 may, in certain exemplary embodiments, be disposed on display panel 100. In this manner, upper cover 410 may be geometrically configured in accordance with display panel 100; however, it is contemplated that upper cover 410 may be configured in accordance with any suitable arrangement. In any event, upper cover 410 may include display window 411 formed therethrough and, thereby, configured to expose at least a portion of display area 140 associated with display panel 100. Accordingly, upper cover 410 may be configured to include upper surface 412 that is, in turn, configured to support at least one front end portion of display panel 100 and liquid crystal lens panel 200.

Upper cover 410 may also include one or more upper cover side surfaces 414 that, for instance, extend from upper surface 412 and towards lover cover 420. In certain exemplary embodiments, upper surface 412 may be bent (or otherwise manipulated) towards lower cover 420 and, thereby, configured to define at least some of upper cover side surfaces 414 or at least a transitional surface between upper surface 412 and upper cover side surface(s) 414. As seen in the illustrated exemplary embodiment, upper cover 410 may be correspondingly configured in accordance with the above-noted rectangular configuration associated with display panel 100 and liquid crystal lens panel 200. In this manner, upper cover 410 may include four upper cover side surfaces 414. As previously mentioned, however, it is contemplated that upper cover 410 may be additionally or alternatively configured in accordance with any suitable geometric configuration. It is further noted that upper cover 410 may be connected to lower cover 420, so as to support the above-noted at least one front end portion of display panel 100 and liquid crystal lens panel 200.

Accordingly, lower cover 420 may, in various exemplary embodiments, be disposed farther away from at least one viewer than backlight unit 300 and, thereby, disposed in the at least one "negative" image-emitting direction associated with display panel 100. Lower cover 420 may be geometrically configured in accordance with display panel 100, liquid crystal lens panel 200, and backlight unit 300; however, it is contemplated that lower cover 420 may be configured in accordance with any suitable arrangement. In any event, lower cover 420 may include bottom surface 422 and one or more lower cover side surfaces 424 that, for instance, extend from bottom surface 422 and towards upper cover 410.

In certain exemplary embodiments, bottom surface 422 may be bent (or otherwise manipulated) towards upper cover 410 and, thereby, configured to define at least some of lower cover side surface(s) 414. As seen in the illustrated exemplary embodiment, lower cover 420 may be correspondingly configured in accordance with the above-noted rectangular configuration associated with display panel 100 and liquid crystal lens panel 200. In this manner, lower cover 420 may include four lower cover side surfaces 424. As also previously mentioned, it is contemplated, however, that lower cover 420 may be additionally or alternatively configured in accordance with any suitable geometric configuration. It is further noted that lower cover 420 may be configured to include a space (or cavity region) via arrangement of bottom surface 422 and lower cover surface(s) 424 and, thereby, configured to accommodate, for example, display panel 100 and backlight unit 300. Moreover, lower cover 420 may be connected to upper cover 410, so as to accommodate and support display panel 100 and backlight unit 300.

Figure 3:
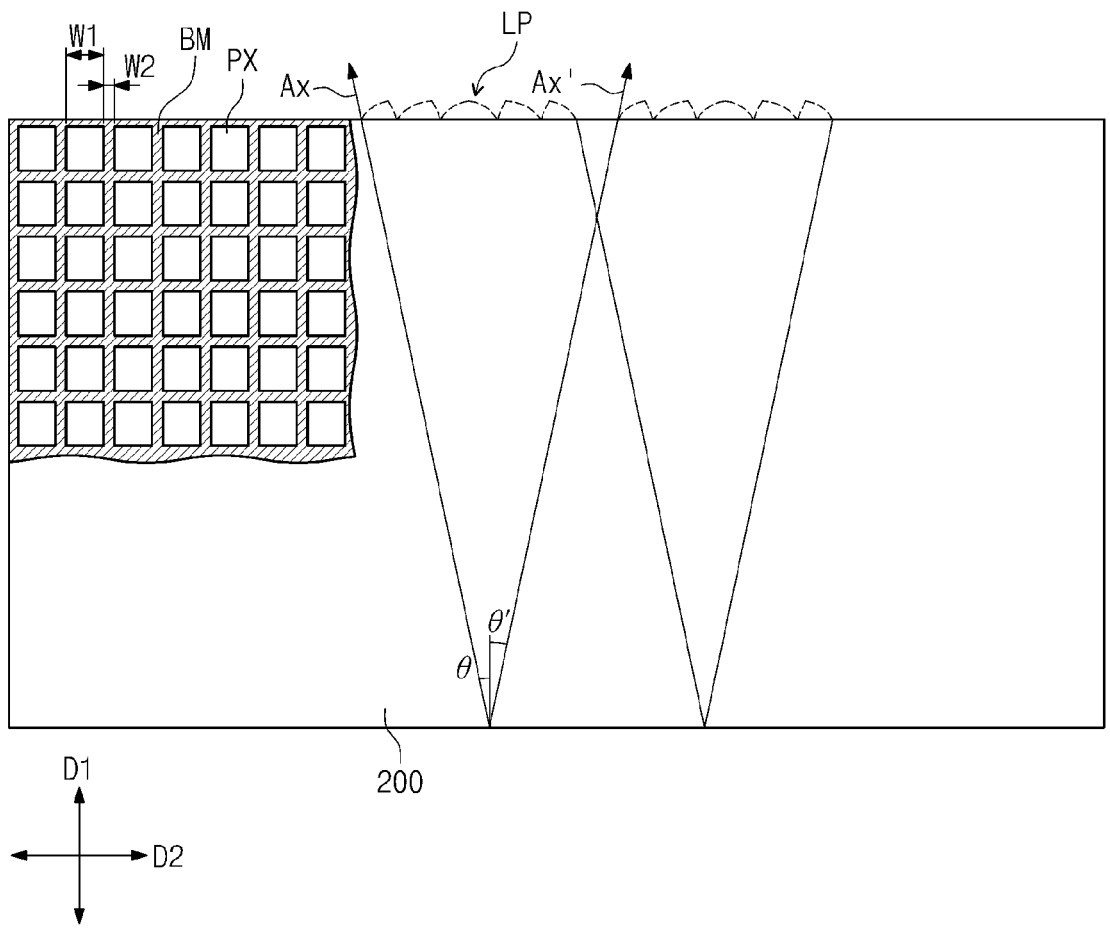
FIG. 3 is a plan view of a display panel and a liquid crystal lens panel of the autostereoscopic display apparatus of FIG. 1, according to an exemplary embodiment.

FIG. 3 is a plan view of a display panel and a liquid crystal lens panel of the autostereoscopic display apparatus of FIG. 1, according to an exemplary embodiment.

With continued reference to FIGS. 1 and 2, display panel 100 may, according to various exemplary embodiments, include a first side that extends parallel (or substantially parallel) to a first imaginary direction D1 and a second side that extends parallel (or substantially parallel) to a second imaginary direction D2. In this manner, a length of the first side may be shorter than a length of the second side. Additionally, display panel 100 may be configured to include one or more pixels, such as pixels PX, which may be spatially positioned (or otherwise arranged) according to one or more configurations, such as according to a matrix configuration. For instance, the plurality of pixels PX may be uniformly positioned and, thereby, spaced in one or more row and column formations. As seen in FIG. 3, individual pixels PX may be separated by, for instance, light blocking pattern BM.

According to various exemplary embodiments, individual pixels PX exhibit first width W1 extending in second direction D2 and light blocking pattern BM exhibits second width W2, which also extends in second direction D2.

Liquid crystal lens panel 200, however, may be configured to include one or more lens parts, such as a plurality of lens parts LP. According to one exemplary embodiment, individual lens parts LP may be inclined along a lens axis, which may be inclined with respect to at least one of the first side and the second side of liquid crystal lens panel 200. For instance, individual lens parts LP may be inclined with respect to the first side of liquid crystal lens panel 200. Accordingly, lens parts LP may exhibit first lens axis Ax inclined at first inclination angle θ with respect to the first side of liquid crystal lens panel 200 or second lens axis Ax', which may be inclined at second inclination angle θ' also with respect to the first side.

According to various exemplary embodiments, first lens axis Ax and second lens axis Ax' may be symmetrically (or substantially symmetrically) configured with one another and with respect to the first side of liquid crystal lens panel 200. Namely, first lens axis Ax and second lens axis Ax' may be "mirror" reflections of one another, e.g., second lens axis Ax' may be (or about be) −180° displaced from first lens axis Ax. It is contemplated, however, that first lens axis Ax and second lens axis Ax' may be additionally or alternatively configured.

In one exemplary embodiment, first inclination angle θ and second inclination angle θ' may exhibit one or more characteristics adhering to Equations 1 and 2 provided below. As such, first inclination angle θ and second inclination angle θ' may be further configured in accordance with a structure of pixels PX associated with display panel 100. If, for instance, first inclination angle θ and second inclination angle θ' are symmetrically configured, e.g., θ'=θ−180°, such that θ=θ' if respectively measured in corresponding clockwise and counterclockwise directions, Equations 1 and 2 may be utilized to characterize first inclination angle θ.

$$W_2 < \frac{1}{2} W_1 * \cos\theta \qquad \text{Equation 1}$$

$$W_2 < \frac{1}{2}(W_1 + W_2) * \cos\theta \qquad \text{Equation 2}$$

It is noted that adherence to Equations 1 and 2 by first inclination angle θ and second inclination angle θ' may prevent one or more undesirable optical phenomena, such as the formation of one or more moiré fringe patterns, which ultimately deteriorate display quality of display panel 100.

Figure 4:
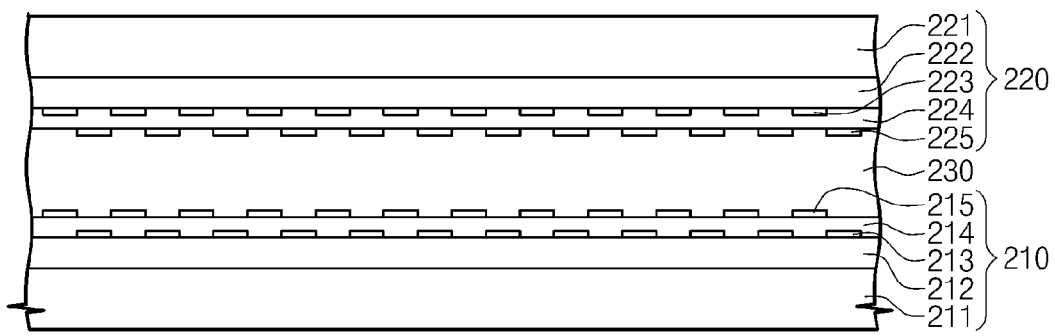
FIG. 4 is a sectional view of a portion of a liquid crystal lens panel of the autostereosocpic display apparatus of FIG. 1, according to an exemplary embodiment.

FIG. 4 is a sectional view of a portion of liquid crystal lens panel 100 of display apparatus 100 of FIG. 1, according to an exemplary embodiment. In this manner, FIG. 5 depicts a plan view of the plurality of first electrodes 213 and the plurality of second electrodes 215 disposed on first substrate 210 of liquid crystal lens panel 200, whereas FIG. 6 illustrates a plan view of the plurality of third electrodes 223 and the plurality of fourth electrodes 225 disposed on second substrate 220 of liquid crystal lens panel 200.

Figure 5:
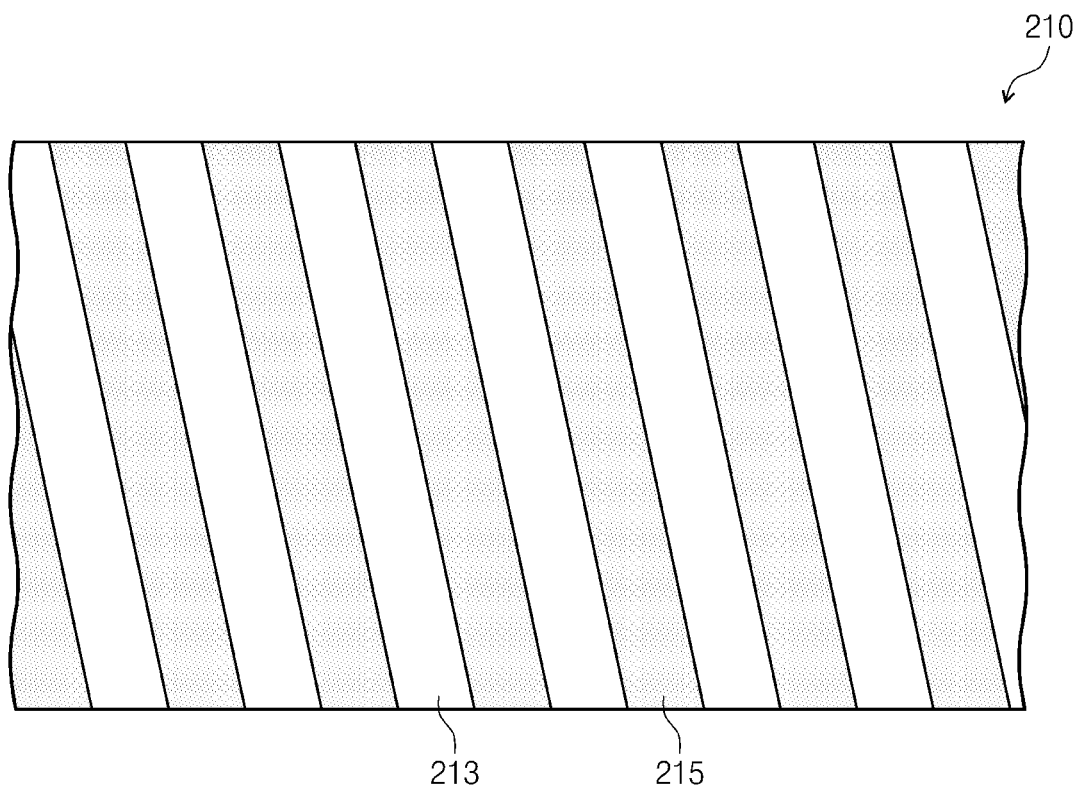
FIG. 5 is a plan view of a first electrode pattern and a second electrode pattern disposed on a first substrate of the liquid crystal lens panel of FIG. 4, according to an exemplary embodiment.
Figure 6:
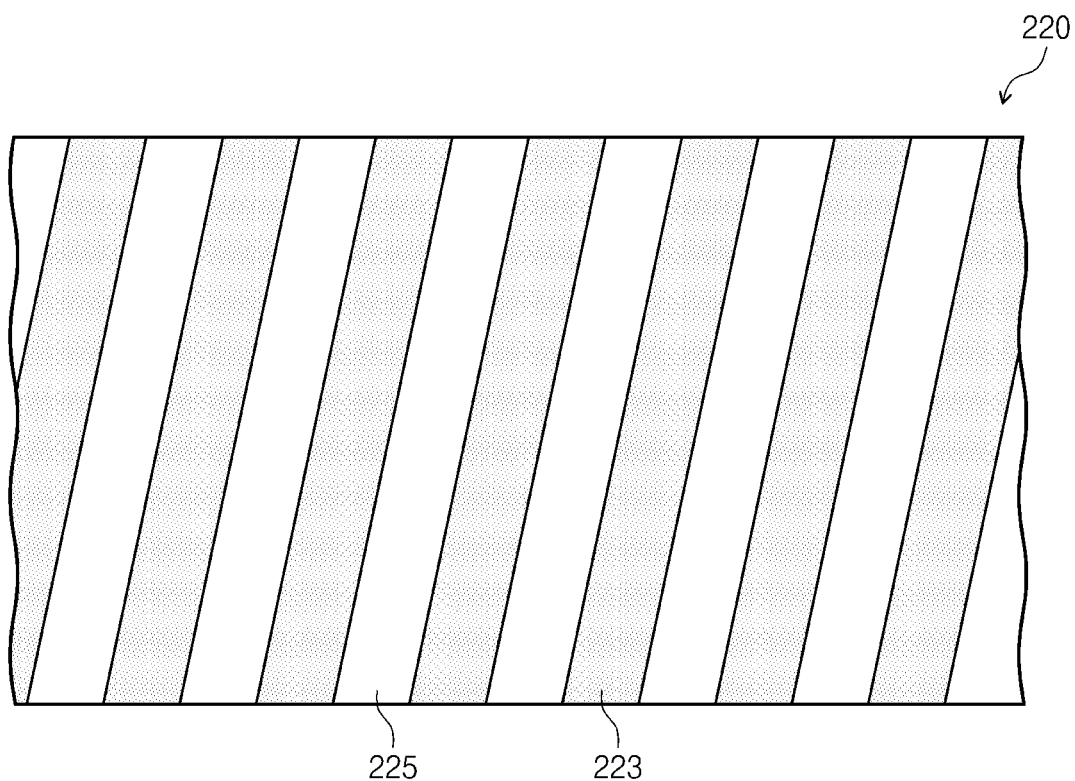
FIG. 6 is a plan view of a third electrode pattern and a fourth electrode pattern disposed on a second substrate of the liquid crystal lens panel of FIG. 4, according to an exemplary embodiment.

As seen in FIGS. 4-6, liquid crystal lens panel 200 may be configured to include one or more components, such as first substrate 210, second substrate 220 configured to face first substrate 210, and second liquid crystal layer 230, which may be disposed between first substrate 210 and second substrate 220.

According to certain exemplary embodiments, first substrate 210 includes first base substrate 211, a plurality of first electrodes 213 disposed on first base substrate 211, first insulating layer 214 disposed on and to cover the plurality of first electrodes 213, and a plurality of second electrodes 215 disposed on first insulating layer 214. In one exemplary embodiment, the respective pluralities of first electrodes 213 and second electrodes 215 may be configured in accordance with one or more "stripe" patterns, as will become more apparent below. It is contemplated; however, that the respective pluralities of first electrodes 213 and second electrodes 215 may be additionally and/or alternatively configured, such as in accordance with a particular display apparatus configuration or application. In one exemplary embodiment, respective ones of the plurality of first electrodes 213 may be parallel (or substantially parallel) to and alternately arranged with respect to respective ones of the plurality of second electrodes 215. Further, respective widths of the plurality of first electrodes 213 may be the same as the respective widths of the plurality of second electrodes 215. In any event, second insulating layer 212 may be disposed between first base substrate 211 and the plurality of first electrodes 213.

Second substrate 220 may, according to various exemplary embodiments, include second base substrate 221, a plurality of third electrodes 223 disposed on second base substrate 221, third insulating layer 224 disposed on and to cover the plurality of third electrodes 223, and a plurality of fourth electrodes 225 disposed on third insulating layer 224. As with the respective pluralities of first electrodes 213 and second electrodes 215, the respective pluralities of third electrodes 223 and fourth electrodes 225 may be configured in accordance with one or more similar or other "stripe" patterns, as will also become more apparent below. It is contemplated; however, that the respective pluralities of third electrodes 223 and fourth electrodes 225 may be additionally and/or alternatively configured, such as in accordance with a particular display apparatus configuration or application. In one exemplary embodiment, respective ones of the plurality of third electrodes 223 may be parallel (or substantially parallel) to and alternately arranged with respect to respective ones of the plurality of fourth electrodes 225. Further, respective widths of the plurality of third electrodes 223 may be the same as respective widths of the plurality of fourth electrodes 225. Fourth insulating layer 222 may, based on one or more exemplary embodiments, be disposed between second base substrate 221 and the plurality of third electrodes 223.

According to various exemplary embodiments, first base substrate 211 and second base substrate 221 may be similarly configured to exhibit a rectangular geometric configuration (e.g., shape) including the above-noted first sides and second sides. Again, it is contemplated that one or more of first base substrate 211 and second base substrate 221 may be additionally or alternatively configured.

In certain exemplary embodiments, first, second, third, and fourth insulating layers 212, 214, 222, 224 may be manufactured from one or more transparent insulating materials through which source illumination may be allowed to propagate. For example, one or more of first, second, third, and fourth insulating layers 212, 214, 222, 224 may be manufactured from silicon oxide (SiOx), silicon nitride (SiNx), or any other suitable material.

According to various exemplary embodiments, the respective pluralities of first, second, third, and fourth electrodes 213, 215, 223, and 225 may be manufactured from one or more transparent conductive materials, such as aluminum zinc oxide (AZO), gallium zinc oxide (GZO), indium tin oxide (ITO), indium zinc oxide (IZO), and/or the like.

The plurality of first electrodes 213 and the plurality of second electrodes 215 may extend in at least one direction parallel (or substantially parallel) to first lens axis Ax associated with lens parts LP as seen in, for instance, FIG. 3. That is, the respective pluralities of first and second electrodes 213 and 215 may extend in at least one direction inclined with respect to the above-noted first sides or second sides and, thereby, exhibit the same (or substantially the same) inclination angle as first inclination angle θ associated with first lens axis Ax. In one exemplary embodiment, the respective pluralities of first and second electrodes 213 and 215 may extend in a direction inclined with respect to the aforementioned first sides.

Accordingly, the respective pluralities of third electrodes 223 and fourth electrodes 225 may extend in at least one direction parallel (or substantially parallel) to second lens axis Ax' associated with lens parts LP, as seen in, for example, FIG. 3. That is, the respective pluralities of third and fourth electrodes 223 and 225 may extend in at least one direction inclined with respect to the above-noted first sides and, thereby, exhibit the same (or substantially the same) inclination angle as second inclination angle θ' associated with second lens axis Ax'.

In various exemplary embodiments, the direction in which the respective pluralities of third electrodes 223 and fourth electrodes 225 extend may be symmetrical (or substantially symmetrical) with respect to the direction in which the respective pluralities of first electrodes 213 and second electrodes 215 extend with respect to, for instance, second direction D2. For instance, in one exemplary embodiment, the direction of extension associated with the respective pluralities of first and second electrodes 213 and 215 may be a "mirror reflection" of the direction of extension associated with the respective pluralities of third and fourth electrodes 223 and 225.

Illustrative operation(s) of display apparatus 500 according to various exemplary embodiments will now be described in more detail with reference to FIGS. 3 and 7-16.

Figure 7:
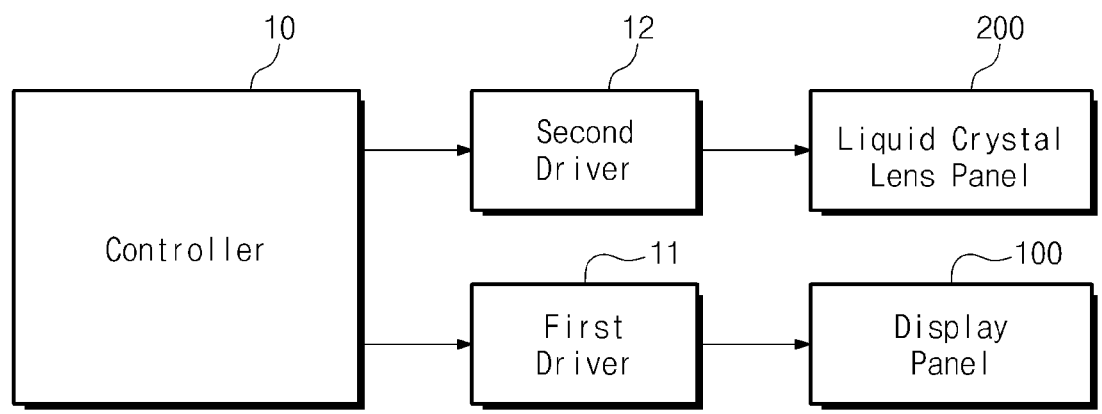
FIG. 7 is a block diagram of an autostereoscopic display apparatus, according to an exemplary embodiment.
Figure 8:
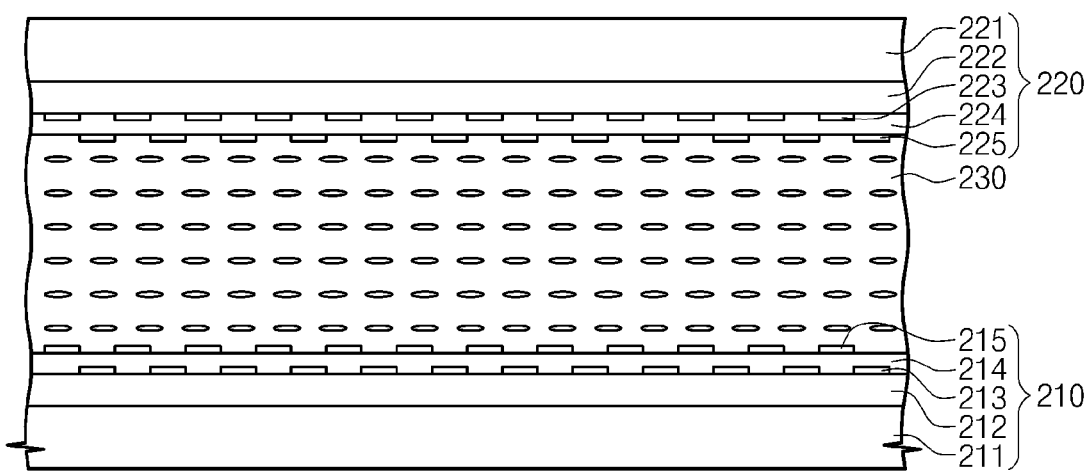
FIG. 8 is a sectional view of a portion of an autostereoscopic display apparatus configured to present 2D images, according to an exemplary embodiment.
Figure 9:
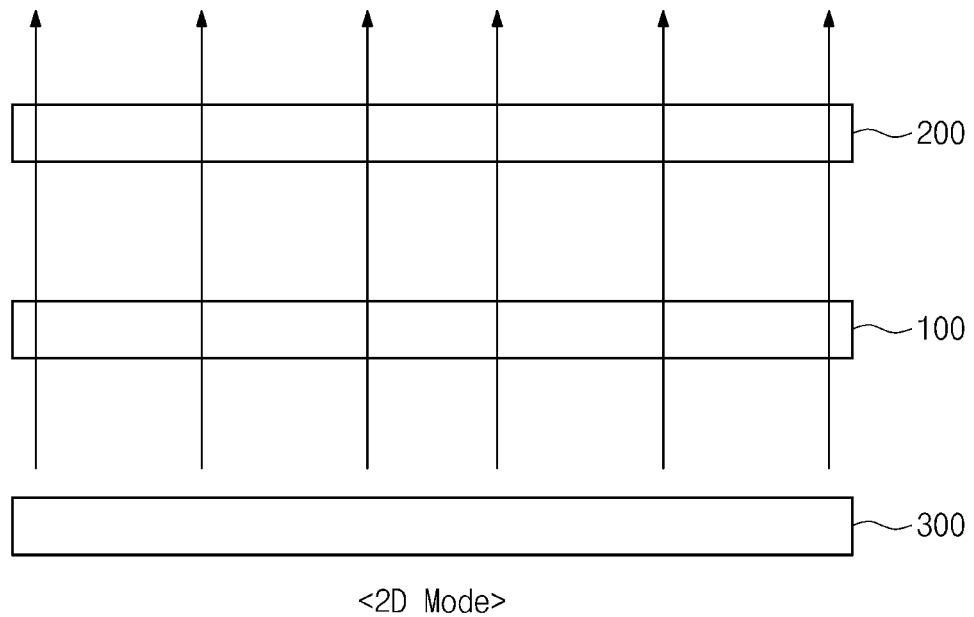
FIG. 9 is a sectional view of another portion of an autostereoscopic display apparatus configured to present 2D images, according to an exemplary embodiment.
Figure 10:
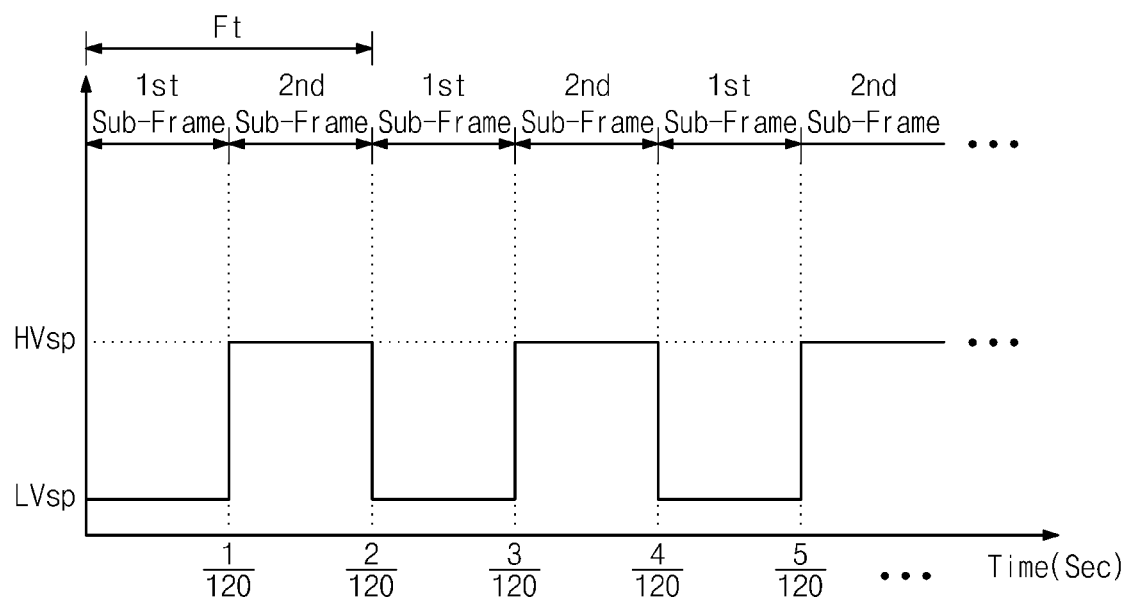
FIG. 10 is a timing diagram of an autostereoscopic display apparatus configured to create (or otherwise enhance) the illusion of depth, according to an exemplary embodiment.
Figure 11:
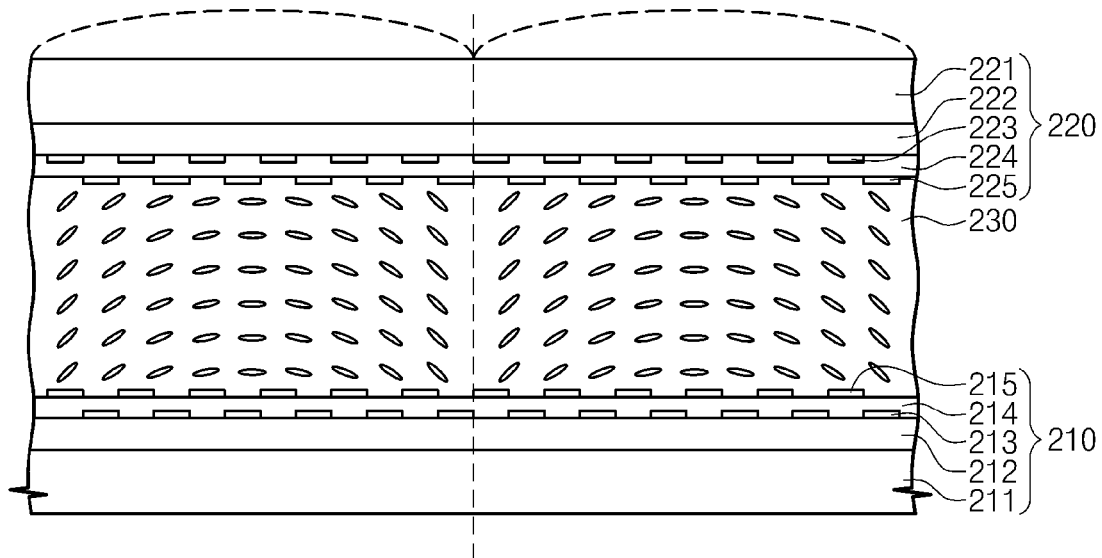
FIG. 11 is a sectional view of a portion of an autostereoscopic display apparatus configured to create (or otherwise enhance) the illusion of depth, according to an exemplary embodiment.
Figure 12:
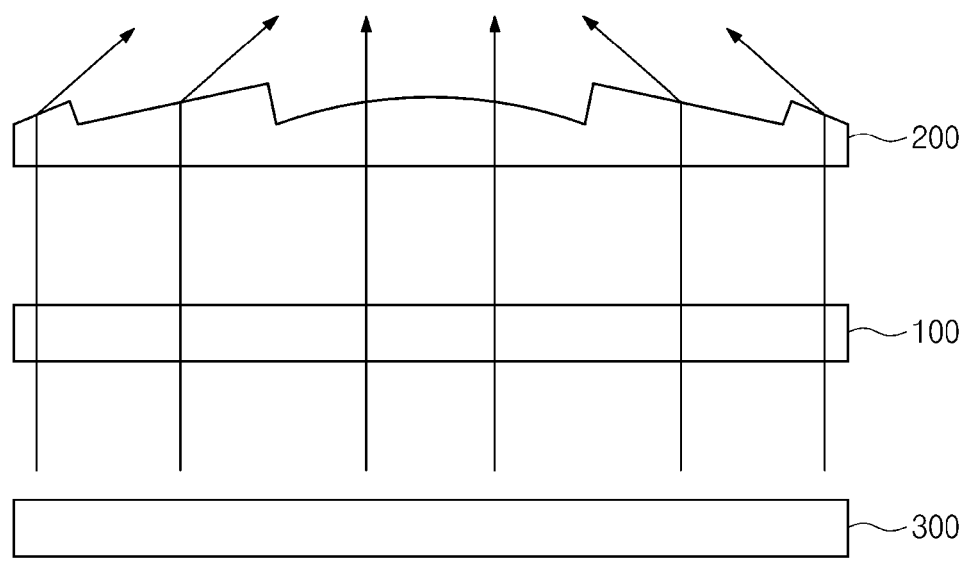
FIG. 12 is a sectional view of another portion of an autostereoscopic display apparatus configured to create (or otherwise enhance) the illusion of depth, according to an exemplary embodiment.
Figure 13:
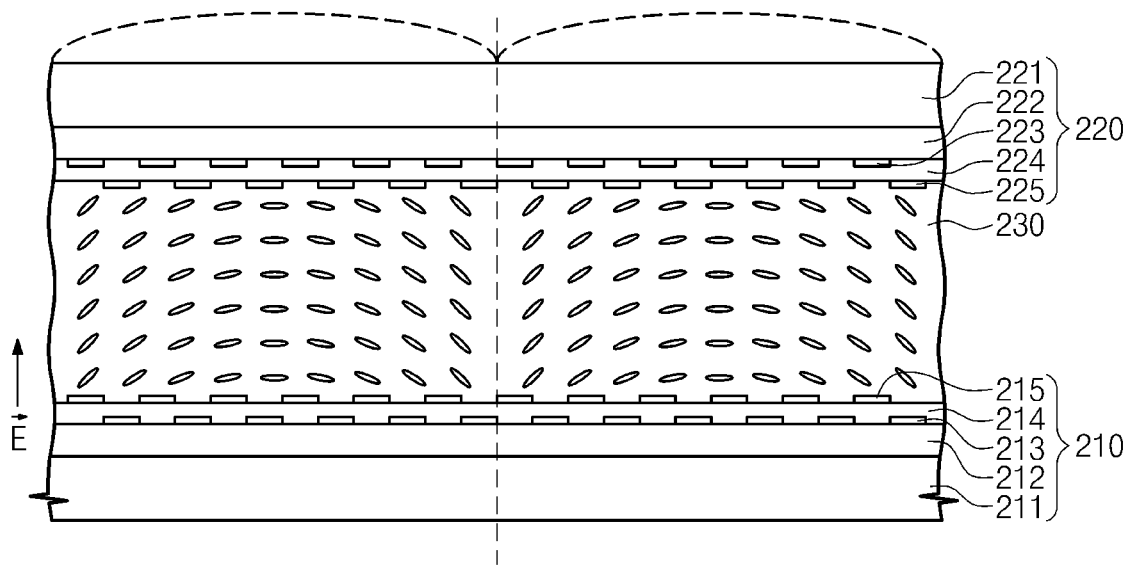
FIGS. 13 and 15 are sectional views of a display panel and a liquid crystal lens panel of an autostereoscopic display apparatus configured to create (or otherwise enhance) the illusion of depth, according to various exemplary embodiments.
Figure 14:
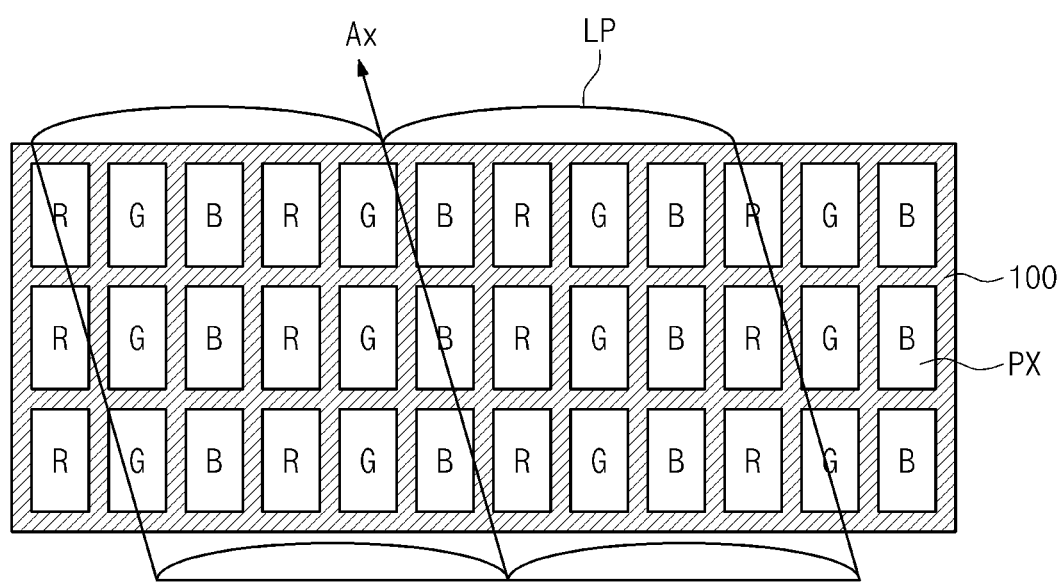
FIGS. 14 and 16 depict respective propagation directions of left-eye and right-eye images based on the corresponding configurations of the autosterescopic display apparatus of FIGS. 13 and 15, according to various exemplary embodiments.
Figure 15:
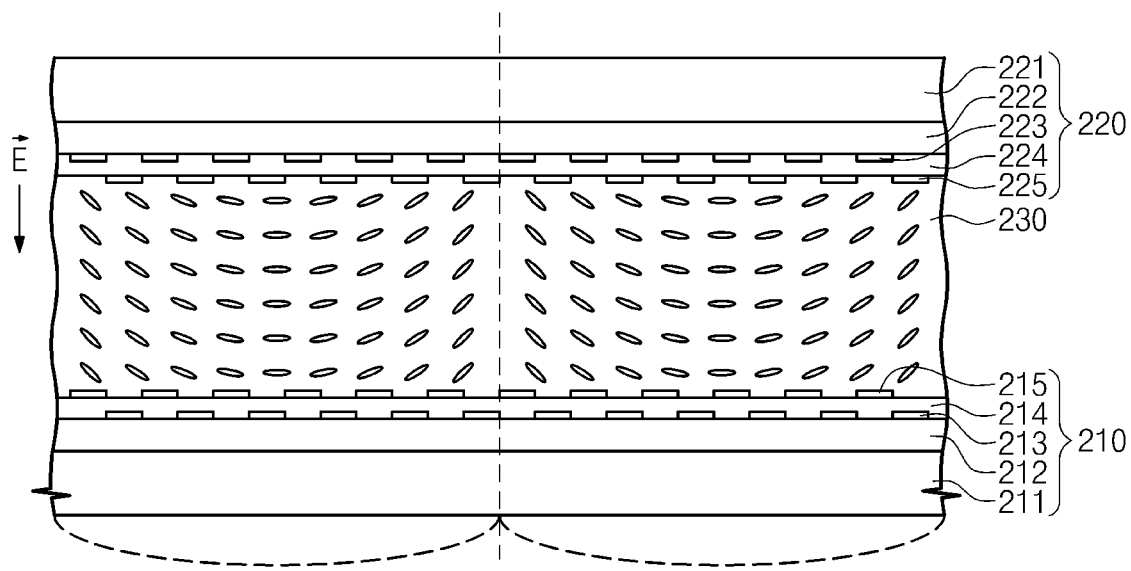
Figure 16:
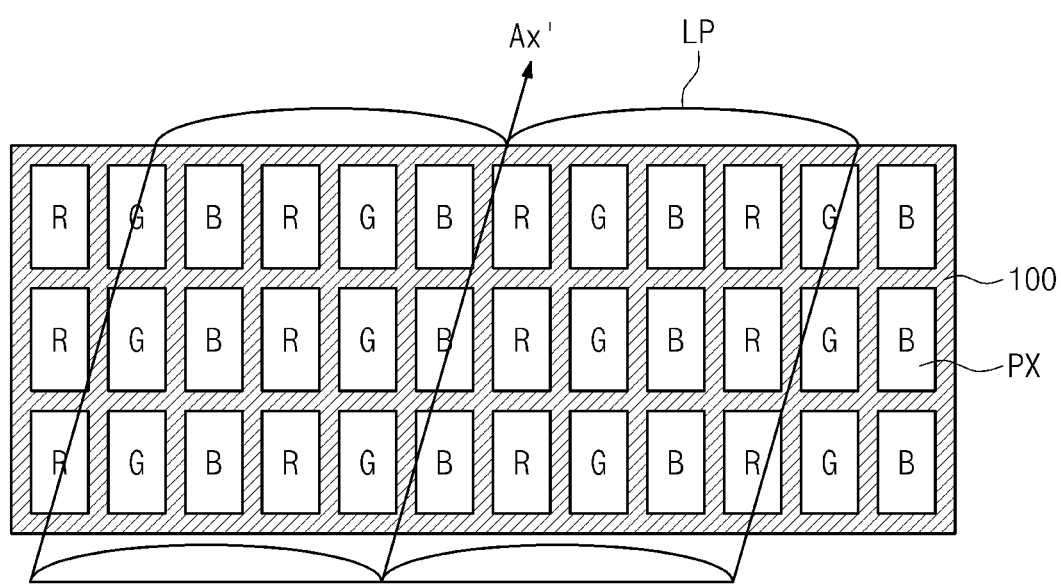

FIG. 7 is a block diagram of an exemplary autostereoscopic display apparatus. FIGS. 8 and 9 are sectional views of various portions of an autostereoscopic display apparatus configured to present 2D images, according to various exemplary embodiments; whereas FIGS. 11 and 12 are sectional views of various portions of an autostereoscopic display apparatus configured to create (or otherwise enhance) the illusion of depth, according to various other exemplary embodiments. FIG. 10 depicts an illustrative timing diagram of an exemplary autostereoscopic display apparatus configured to create (or otherwise enhance) the illusion of depth. It is further noted that FIGS. 13 and 15 provide sectional views of a display panel and a liquid crystal lens panel of an autostereoscopic display apparatus configured to create (or otherwise enhance) the illusion of depth, according to various exemplary embodiments. FIGS. 14 and 16 depict respective propagation directions of left-eye and right-eye images based on the corresponding configurations of the autosterescopic display apparatus of FIGS. 13 and 15.

Adverting to FIG. 7, the illustrated display apparatus includes, for example, at least one controller 10, at least one first driver 11, at least one second driver 12, display panel 100, and liquid crystal lens panel 200. While specific reference will be made hereto, it is contemplated the illustrated display apparatus may embody many forms and include multiple and/or alternative components and configurations.

According to certain exemplary embodiments, controller 10 may be configured to generate one or more image control signals to control (or otherwise manipulate) at least one presentation provided via display panel 100. Controller 10 may be further configured to generate one or more light control signals to control (or otherwise manipulate) liquid crystal lens panel 200, which may be in response to or in accordance with the image control signal(s).

First driver 11 is configured to receive the one or more image control signals generated by controller 10 and, thereby, may be further configured to control display panel 100 in response to the image control signal(s).

Second driver 12 may be configured to receive the one or more light control signals generated by controller 10 and, thereby, further configured to control liquid crystal lens panel 200 in response to the light control signal(s).

Accordingly, an exemplary process to present at least one 2D image will be more fully described in association with FIGS. 7-9.

In certain exemplary embodiments, presentation of at least one 2D image may be initiated (or continued) in response to controller 10 generating one or more image control signals to cause, at least in part, presentation of at least one 2D image corresponding to an image frame of display panel 100.

Accordingly, the image control signal(s) may be applied to first driver 11, so that first driver 11 can cause, at least in part, display panel 100 to present the at least one 2D image. That is, display panel 100 may, in response to reception of one or more control signals received from, for instance, first driver 11, present (or otherwise display) the at least one 2D image, which may be facilitated via source illumination radiating from backlight unit 300 in response to, for instance, the one or more image control signals and/or light control signals.

In certain exemplary embodiments, controller 10 may not generate the light control signal(s) and, therefore, liquid crystal lens panel 200 may not receive the light control signal(s) from, for instance, second driver 12. Such instances may be associated with a 2D display mode of the exemplary autostereoscopic display apparatus of FIG. 7. As such, liquid crystal lens panel 200 may transmit source illumination radiating from display panel 100 without modification to one or more propagation characteristics of the source illumination.

Accordingly, since the light control signal(s) is not, in certain exemplary embodiments, applied to liquid crystal lens panel 200, the respective pluralities of first, second, third, and fourth electrodes 213, 215, 223, and 225 associated with liquid crystal lens panel 200 will not be applied (or supplied) with voltages. As such, an electric field (or flux) may not be formed between first substrate 210 and second substrate 220 associated with liquid crystal lens panel 200. Since no electric field may be applied, the liquid crystal molecules associated with second liquid crystal layer 230 may be maintained in accordance with an "initial" or "unexcited" alignment state.

Thus, source illumination propagating through and, thereby, radiating from display panel 100 may further propagate through liquid crystal lens panel 200 without refraction, such that one or more viewers are enabled to perceive the at least one 2D image.

An exemplary process to facilitate the illusion of depth via an autostereoscopic display apparatus will be described in more detail in association with FIGS. 7 and 10-16.

In one exemplary embodiment, presentation of one or more 2D images exhibiting a binocular disparity may be initiated (or continued) in response to controller 10 generating one or more image control signals to cause, at least in part, presentation of at least one 2D image corresponding to at least one image frame of display panel 100. It is noted, however, that controller 10 may, in association with this exemplary embodiment, also generate one or more light control signals corresponding to and/or based on the image control signal(s). As will become more apparent below, the light control signal(s) may be utilized to effectuate the aforementioned binocular disparity effects and, thereby, auto-facilitate a viewer's perception of depth.

In this manner, the image control signal(s) may be applied (or supplied) to first driver 11, so that first driver 11 can cause, at least in part, display panel 100 to present the at least one 2D image. That is, display panel 100 may be caused, at least in part, to display one or more 2D images, which may be perceived as at least one 3D image by way of source illumination radiating from backlight unit 300 in response to, for instance, the image control signal(s).

Further, the light control signal(s) may be applied (or supplied) to second driver 12, so that second driver 12 can cause, at least in part, liquid crystal lens panel 200 to manipulate the propagation characteristics of source illumination radiating therethrough. In other words, liquid crystal lens panel 200 may form one or more lens parts LP in response to receiving the light control signal(s). According to various exemplary embodiments, individual lens parts LP may be configured to form one or more Fresnel lens parts. In this manner, liquid crystal lens panel 200 may refract source illumination propagating therethrough and, thereby, radiating from display panel 100. Due to the controlled refraction of the source illumination, the various 2D images may be perceived by at least one viewer as at least one 3D image.

In more detail, display panel 100 alternately presents a 2D left-eye image and a 2D right-eye image in one frame in response to the image control signal(s) generated by controller 10. For instance, assuming a frame period $F_t$ corresponding to an image frame of $\frac{1}{60}$ seconds, controller 10 may generate the one or more image control signals to automatically separate the image frame into a first sub-frame to enable display panel 100 to present a left-eye image during a $\frac{1}{120}$ second period and a second sub-frame to enable display panel 100 to present a right-eye image during another $\frac{1}{120}$ second period. In this manner, two sub-frame periods may constitute a single image frame; however, it is contemplated that image frames may be additionally or alternatively configured. For instance, one or more image frames may be configured include more or less than two sub-frame periods.

To this end, first driver 11 may drive or otherwise cause, at least in part, display panel 100 to present the respective left-eye and right eye images in response to, for example, the image control signal(s). That is, first driver 11 may apply (or otherwise transmit) one or more driving signals, which may respectively correspond to one or more sub-frames (e.g., the first and second sub-frames), to display panel 100 in response to, for example, the image control signal(s).

Accordingly, display panel 100 may, in response to the one or more driving signals, present the respective 2D left-eye and right-eye images to one or more viewers who, in turn, may perceive the respective 2D left-eye and right-eye images as one or more 3D images. In other words, display panel 100 may present left-eye images and right-eye images corresponding to respective first sub-frames and second sub-frames.

As a part of this process, controller 10 may further generate the one or more light control signals, which may correspond to or be generated based on the image control signal(s). The one or more light control signals may be generated to drive (or otherwise manipulate) one or more properties and/or display characteristics of liquid crystal lens panel 200. For instance, controller 10 may generate one or more first light control signals corresponding to a first sub-frame and one or more second light control signals corresponding to a second sub-frame. In this manner, the one or more first and second light control signals may cause, at least in part, second driver 12 to drive liquid crystal lens panel 200.

According to various exemplary embodiments, when at least one first light control signal is applied to liquid crystal lens panel 200, the plurality of first electrodes 213 and the plurality of second electrodes 215 may be applied (or supplied) with one or more voltages. As such, magnitude(s) of the voltages applied to the plurality of first electrodes 213 and the plurality of second electrodes 215 may be at a relatively "high" (or "on") state, such that the respective pluralities of first and second electrodes 213 and 215 may cause, at least in part, liquid crystal molecules associated with second liquid crystal layer 230 to be manipulated based on and in accordance with a distance from a central axis associated with one or more lens parts LP. The relatively "high" state may correspond to HVsp, as seen in FIG. 10.

Accordingly, application (or supply) of the voltage(s) to the respective pluralities of first and second electrodes 213 and 215 may cause, at least in part, an electric field (or flux) to be formed between first substrate 210 and second substrate 220 in response to a first light control signal being non-uniform, such as seen in FIGS. 13 and 14. In this manner, the liquid crystal molecules of second liquid crystal layer 230 may be spatially positioned and/or aligned in one or more, e.g., different, directions. For example, the spatial position and/or alignment of respective liquid crystal molecules may be varied based on the application (or imposition) of the electric field. As such, causing, at least in part, magnitude(s) of the voltages applied to the plurality of first electrodes 213 and the plurality of second electrodes 215 to become "high," the respective pluralities of first and second electrodes 213 and 215 may cause, at least in part, liquid crystal molecules associated with second liquid crystal layer 230 to be manipulated based on and in accordance with a distance from a central axis associated with one or more lens parts LP. In addition, at least one alignment angle associated with liquid crystal molecules spatially disposed in an area adjacent to the central axis may be caused, at least in part, to be relatively "smaller" than at least one alignment angle associated with liquid crystal molecules spatially disposed in an area relatively "farther away" from the central axis. In this manner, individual lens parts LP may be configured as respective Fresnel lens parts.

According to exemplary embodiments, lens axis Ax associated with lens part(s) LP may be parallel (or substantially parallel) to at least one direction in which the plurality of first electrodes 213 and the plurality of second electrodes 215 extend.

Contrastingly, when at least one second light control signal is applied to liquid crystal lens panel 200, the plurality of third electrodes 223 and the plurality of fourth electrodes 225 may be applied (or supplied) with one or more voltages. As such, magnitude(s) of the voltages applied to the plurality of third electrodes 223 and the plurality of fourth electrodes 225 may be at a relatively "high" (or "on") state, such that the respective pluralities of third and fourth electrodes 223 and 225 may cause, at least in part, liquid crystal molecules associated with second liquid crystal layer 230 to be manipulated based on and in accordance with a distance from a central axis associated with lens part LP. Again, the "high" voltage may correspond to HVsp as seen in FIG. 10.

Accordingly, application (or supply) of the voltage(s) to the respective pluralities of third and fourth electrodes 223 and 225 may cause, at least in part, an electric field (or flux) to be formed between first substrate 210 and second substrate 220 in response to a second light control signal being non-uniform, such as seen in FIGS. 15 and 16. In this manner, the liquid crystal molecules of second liquid crystal layer 230 may be spatially positioned and/or aligned in one or more, e.g., different, directions. For example, the spatial position and/or alignment of respective liquid crystal molecules may be varied based on the application (or imposition) of the electric field. In this manner, individual lens parts LP may be configured as respective Fresnel lens parts.

In various exemplary embodiments, lens axis Ax' associated with lens part(s) LP may be parallel (or substantially parallel) to at least one direction in which the respective pluralities of third and fourth electrodes 223 and 225 extend. It is further noted that lens axis Ax' associated with lens part(s) LP based on imposition of at least one second light control signal may be symmetrical (or substantially symmetrical) with lens axis Ax associated with lens part(s) LP based on the imposition of at least one first light control signal, both of which being defined with respect to an imaginary direction parallel (or substantially parallel) to second direction D2. According to one embodiment, lens axes Ax and Ax' may be inclined at respective inclination angles $\gamma_1$ and $\gamma_2$, where $\gamma_1$ or $\gamma_2$ is (or is about) 180° negatively displaced from $\gamma_2$ or $\gamma_1$. In other words, lens axes Ax and Ax' may be "mirror reflections" of one another.

Accordingly, causing, at least in part, lens axes Ax and Ax' associated with lens part(s) LP associated with liquid crystal lens panel 200 to be symmetrical (or substantially symmetrical) with one another, 2D images associated with a first sub-frame may be overlapped with images associated with a second sub-frame. In this manner, the viewer may be enabled to perceive the various 2D images (e.g., left-eye images and right eye-images) as at least one 3D image, which may be free of adverse (or otherwise undesirable) optical noise, such as free of moiré fringe patterns.

Figure 17:
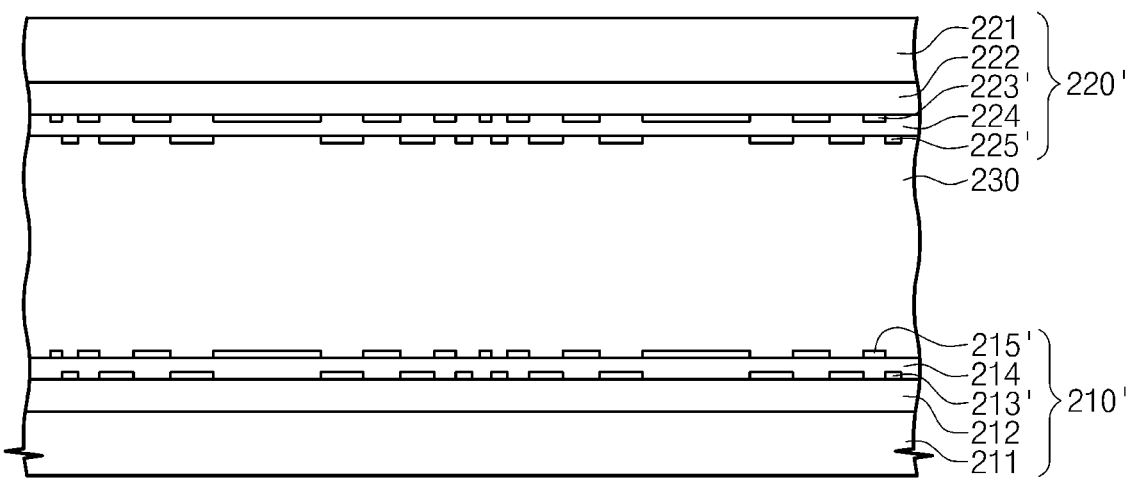
FIG. 17 is a sectional view of a portion of another display panel and another liquid crystal lens panel of an autostereoscopic display apparatus, according to another exemplary embodiment.
Figure 18:
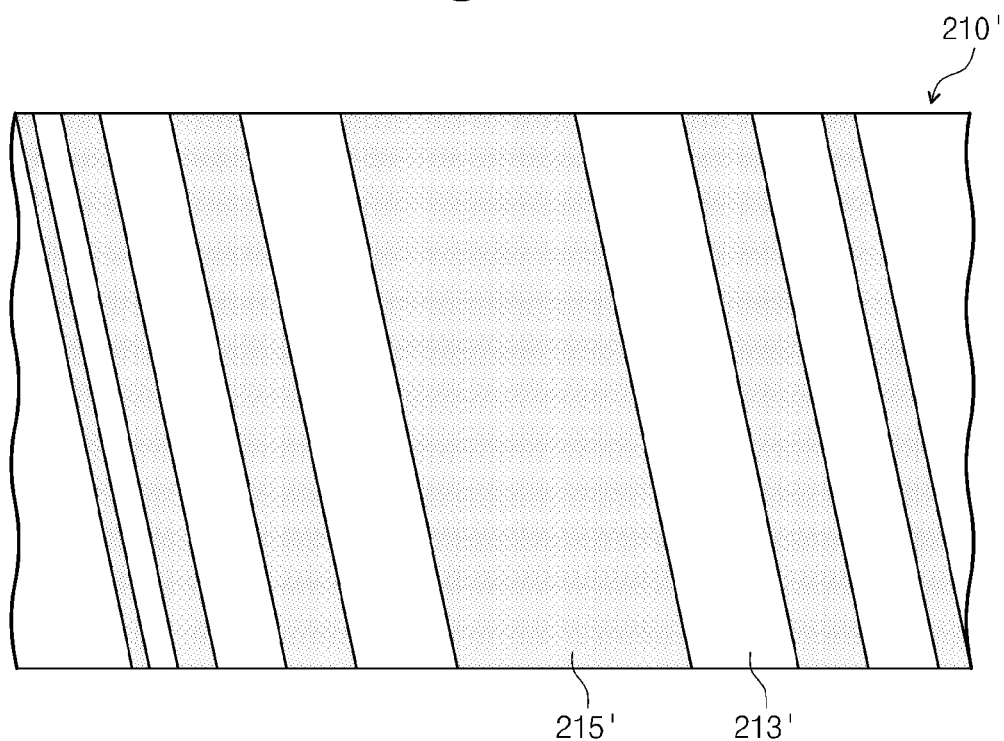
FIG. 18 is a plan view of a first electrode pattern and a second electrode pattern disposed on a first substrate of the liquid crystal lens panel of FIG. 17, according to an exemplary embodiment.
Figure 19:
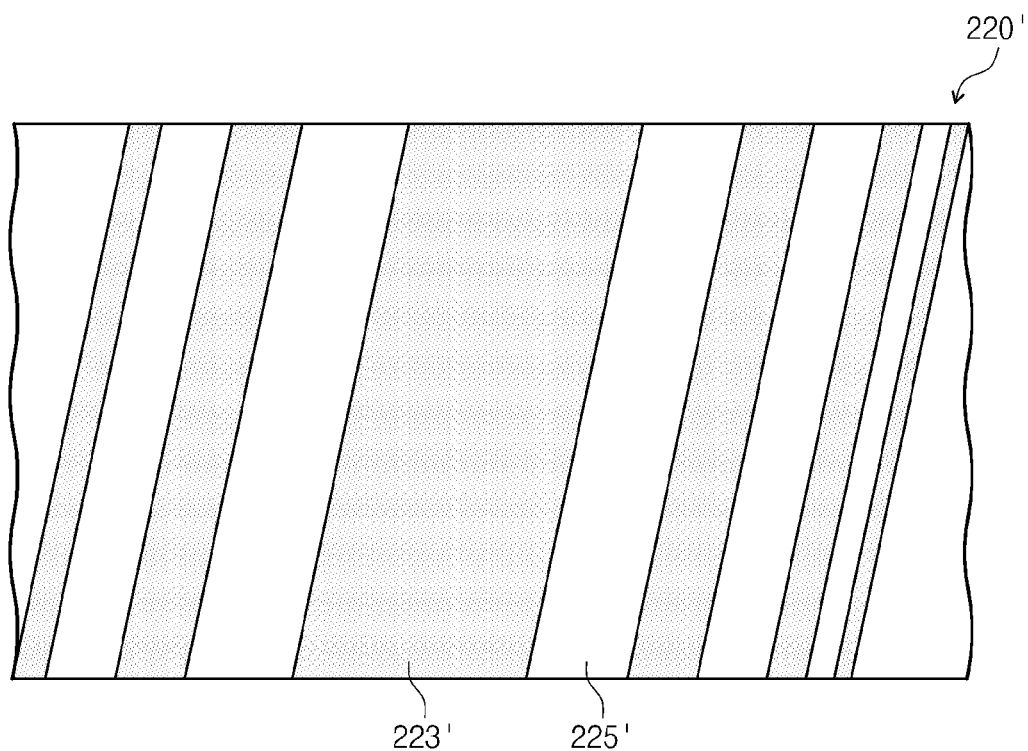
FIG. 19 is a plan view of a third electrode pattern and a fourth electrode pattern disposed on a second substrate of the liquid crystal lens panel of FIG. 17, according to an exemplary embodiment.

FIG. 17 is a sectional view of a portion of another display panel and another liquid crystal lens panel of an autostereoscopic display apparatus, according to another exemplary embodiment. FIG. 18 is a plan view of a first electrode pattern and a second electrode pattern disposed on a first substrate of the liquid crystal lens panel of FIG. 17, according to an exemplary embodiment; whereas FIG. 19 depicts a plan view of a third electrode pattern and a fourth electrode pattern disposed on a second substrate of the exemplary liquid crystal lens panel of FIG. 17. It is noted that like reference numerals denote like elements, such that in association with FIGS. 17-19, corresponding elements are similarly referenced as in association with FIGS. 1-16. As such, corresponding detailed descriptions of similar components have been omitted for the sake of brevity and to prevent unnecessarily obscuring various exemplary embodiments disclosed in association with FIGS. 17-19.

As seen in FIGS. 17-19, liquid crystal lens panel 200' may be configured to include one or more components, such as first substrate 210', second substrate 220' disposed to face first substrate 210', and second liquid crystal layer 230 disposed between first and second substrates 210' and 220'.

Accordingly, first substrate 210' may include a plurality of first electrodes 213' disposed on first base substrate 211, and a plurality of second electrodes 215' disposed on first insulating layer 214. In one exemplary embodiment, the respective pluralities of first electrodes 213' and second electrodes 215' may be configured in accordance with one or more "stripe" patterns, such as seen in FIG. 18. It is contemplated; however, that the respective pluralities of first electrodes 213' and second electrodes 215' may be additionally and/or alternatively configured, such as in accordance with a particular display apparatus configuration or application. As seen in FIG. 18, respective ones of the plurality of first electrodes 213' may be alternately arranged with respective ones of the plurality of second electrodes 215' in an imaginary plane parallel (or substantially parallel) to a surface of first base substrate 211.

According to various exemplary embodiments, individual lens parts LP associated with the respective pluralities of first and second electrodes 213' and 215' may be disposed relatively adjacent to a central axis associated with respective lens parts LP, and may be configured exhibiting corresponding widths wider than respective electrodes associated with the respective pluralities of first and second electrode patterns 213' and 215', which may be disposed relatively "far away" from the central axis associated with lens part(s) LP.

Second substrate 220' may, in certain exemplary embodiments, include a plurality of third electrodes 223' disposed on second base substrate 221 and a plurality of fourth electrodes 225' disposed on third insulating layer 224. As with the respective pluralities of first electrodes 213' and second electrodes 215', the respective pluralities of third electrodes 223' and fourth electrodes 225' may be configured in accordance with one or more similar or other "stripe" patterns, such as seen in FIG. 19. It is contemplated; however, that the respective pluralities of third electrodes 22'3' and fourth electrodes 225' may be additionally and/or alternatively configured, such as in accordance with a particular display apparatus configuration or application. As also seen in FIG. 19, respective ones of the plurality of third electrodes 223' may be alternately arranged with respective ones of the plurality of fourth electrodes 225' in an imaginary plane parallel (or substantially parallel) to a surface of second base substrate 221. In this manner, individual lens parts LP associated with the respective pluralities of third and fourth electrodes 223' and 225' may be disposed relatively adjacent to a central axis associated with lens part(s) LP, and may be configured exhibiting corresponding widths wider than respective electrodes associated with the respective pluralities of third and fourth electrode patterns 223' and 225', which may be disposed relatively "farther away" from the central axis associated with lens part(s) LP.

Based on the configuration of liquid crystal lens panel 200', formation of an associated electric field (or flux) in association with lens part(s) LP may be non-uniform even if the respective pluralities of first, second, third, and fourth electrodes 213', 215', 223', and 225' are applied (or supplied) with the same one or more voltages. That is, since corresponding widths associated with individual electrodes of the respective pluralities of first, second, third, and fourth electrodes 213', 215', 223', and 225' narrow as corresponding distances from associated central axes of the respective pluralities of first, second, third, and fourth electrodes 213', 215', 223', and 225' increases, the formation of a corresponding electric field may tend to concentrate in association with the varied spacing of corresponding electrodes associated with the respective pluralities of first, second, third, and fourth electrodes 213', 215', 223', and 225' and further in association with increasing distance from respective central axes associated with lens part(s) LP. Accordingly, at least one alignment angle associated with liquid crystal molecules spatially disposed in regions relatively farther from the central axis associated with lens part(s) LP may be relatively larger than at least one alignment angle associated with liquid crystal molecules spatially disposed in regions relatively closer to the central axis. As such, individual lens parts LP may be configured as respective Fresnel lens parts.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A liquid crystal lens panel, comprising:
a first substrate comprising a first base substrate and a plurality of first electrodes disposed on the first base substrate;
a second substrate comprising a second base substrate disposed to face the first base substrate, the second substrate further comprising a plurality of second electrodes disposed on the second base substrate; and
a liquid crystal layer disposed between the first substrate and the second substrate,
wherein each of the first base substrate and the second base substrate are rectilinearly shaped and comprise corresponding first sides and second sides, the plurality of first electrodes and the plurality of second electrodes are inclined with respect to the corresponding first sides and second sides, and
wherein the plurality of first electrodes extend substantially parallel to a first lens axis inclined at a first inclination angle, the plurality of second electrodes extend substantially parallel to a second lens axis inclined at a second inclination angle, and the first lens axis is different from the second lens axis.

2. The liquid crystal lens panel of claim 1, further comprising:
a plurality of third electrodes disposed on the first base substrate, at least some of the plurality of third electrodes being insulated from at least some of the plurality of first electrodes; and
a plurality of fourth electrodes disposed on the second base substrate, at least some of the plurality of fourth electrodes being insulated from at least some of the plurality of second electrodes.

3. The liquid crystal lens panel of claim 2, wherein the at least some of the plurality of first electrodes extend substantially parallel to and are alternated with the at least some of the plurality of third electrode patterns in an imaginary plane, and wherein the at least some of the plurality of second electrodes extend substantially parallel to and are alternated with the at least some of the plurality of fourth electrodes in another imaginary plane.

4. The liquid crystal lens panel of claim 3, further comprising:
a first insulating layer disposed between the at least some of the plurality of first electrodes and the at least some of the plurality of third electrodes, the first insulating layer being disposed to cover the at least some of the plurality of first electrodes.

5. The liquid crystal lens panel of claim 4, further comprising:
a second insulating layer disposed between the at least some of the plurality of second electrodes and the at least some of the plurality of fourth electrodes, the second insulating layer being disposed to cover the at least some of the plurality of second electrodes.

6. The liquid crystal lens panel of claim 1, wherein the first inclination angle and the second inclination angle are symmetrical with each other with respect to the corresponding first sides or second sides.

7. A display apparatus comprising:
a display panel comprising a plurality of pixels and a light blocking pattern disposed to separate respective pixels; and
a liquid crystal lens panel disposed in an image-emitting direction, the liquid crystal lens panel being configured to refract incident source illumination and comprising a plurality of lens parts comprising a lens axis, the lens axis comprising a first lens axis and a second lens axis different from the first lens axis, the liquid crystal lens panel further comprising:
a first substrate comprising a first base substrate and a plurality of first electrodes disposed on the first base substrate,
a second substrate comprising a second base substrate disposed to face the first base substrate, the second substrate further comprising a plurality of second electrodes disposed on the second base substrate, and
a liquid crystal layer disposed between the first substrate and the second substrate,
wherein each of the first base substrate and the second base substrate are rectilinearly shaped and comprise corresponding first sides and second sides, the plurality of first electrodes and the plurality of second electrodes are inclined with respect to the corresponding first sides and second sides, and
wherein the plurality of first electrodes extend substantially parallel to the first lens axis inclined at a first inclination angle and the plurality of second electrodes extend substantially parallel to the second lens axis inclined at a second inclination angle.

8. The display apparatus of claim 7, further comprising:
a plurality of third electrodes disposed on the first base substrate, at least some of the plurality of third electrodes being insulated from at least some of the plurality of first electrodes; and
a plurality of fourth electrodes disposed on the second base substrate, at least some of the plurality of fourth electrodes being insulated from at least some of the plurality of second electrodes.

9. The display apparatus of claim 8, wherein the at least some of the plurality of first electrodes extend substantially parallel to and are alternated with the at least some of the plurality of third electrodes in an imaginary plane, and wherein the at least some of the plurality of second electrodes extend substantially parallel to and are alternated with the at least some of the plurality of fourth electrodes in another imaginary plane.

10. The display apparatus of claim 8, further comprising:
a first insulating layer disposed between the at least some of the plurality of first electrodes and at the least some of the plurality of third electrodes, the first insulating layer being disposed to cover the at least some of the plurality of first electrodes.

11. The display apparatus of claim 10, further comprising:
a second insulating layer disposed between the at least some of the plurality of second electrodes and the at least some of the plurality of fourth electrodes, the second insulating layer being disposed to cover the at least some of the plurality of second electrodes.

12. The display apparatus of claim 7, wherein the first inclination angle and the second inclination angle are symmetrical with each other with respect to the corresponding first sides or second sides.

13. The display apparatus of claim 12, wherein at least one first side comprises a length respectively longer than a corresponding length of at least one second side, individual pixels comprise a first width ($W_1$) that extends in a direction substantially parallel to the at least one first side, the light blocking pattern comprises a second width ($W_2$) that extends in the direction substantially parallel to the at least one first side, the first inclination angle ($\theta$) is inclined with respect to the at least one second side, and further wherein the first width, the second width, and the first inclination angle satisfy the following:

$$W_2 \leq \tfrac{1}{2} W_1 * \cos\theta,$$

and $$W_2 \leq \tfrac{1}{2}(W_1+W_2) * \cos\theta.$$

14. A display apparatus comprising:
a display panel comprising a first side and a second side, the display panel being configured to present a left-eye image and a right-eye image; and
a liquid crystal lens panel disposed in an image-emitting direction, and configured to refract incident light and comprising a plurality of lens parts comprising a controllable lens axis,
wherein the plurality of lens parts comprise, in association with presentation of the left-eye image, a first lens axis inclined at a first inclination angle inclined with respect to one of the first and second sides and comprise, in association with presentation of the right-eye image, a second lens axis inclined at a second inclination angle inclined with respect to the one of the first and second sides, the first lens axis being different from the second lens axis.

15. The display apparatus of claim 14, wherein the first inclination angle and the second inclination angle are symmetrical with each other with respect to the first side or the second side.

16. The display apparatus of claim 15, wherein the display panel further comprises:
a plurality of pixels; and
a light blocking pattern disposed between respective pixels,
wherein the first side comprises a length respectively longer than a length associated with the second side, the pixels comprise a first width ($W_1$), the light blocking pattern comprises a second width ($W_2$), the first inclination angle ($\theta$) is inclined with respect to the second side, and
wherein the first width, the second width, and the first inclination angle satisfy the following:

$$W_2 \leq \tfrac{1}{2} W_1 * \cos\theta,$$

and $$W_2 \leq \tfrac{1}{2}(W_1+W_2) * \cos\theta.$$

17. The display apparatus of claim 14, wherein the liquid crystal lens panel further comprises:
a first substrate comprising a first base substrate and a plurality of first electrodes disposed on the first base substrate;
a second substrate comprising a second base substrate disposed to face the first base substrate, the second substrate further comprising a plurality of second electrodes disposed on the second base substrate; and
a liquid crystal layer disposed between the first substrate and the second substrate,
wherein at least some of the plurality of first electrodes are inclined at a same inclination angle as the first inclination angle, and at least some of the plurality of second electrodes are inclined at a same inclination angle as the second inclination angle.

18. The display apparatus of claim 17, further comprising:
a plurality of third electrodes disposed on the first base substrate, at least some of the plurality of third electrode patterns being insulated from the at least some of the plurality of first electrodes; and
a plurality of fourth electrodes disposed on the second base substrate, at least some of the plurality of fourth electrodes being insulated from the at least some of the plurality of second electrodes.

19. The display apparatus of claim 18, wherein the at least some of the plurality of first electrodes extend substantially parallel to and are alternated with the at least some of the plurality of third electrodes, and the at least some of the plurality of second electrodes extend substantially parallel to and are alternated with the at least some of the plurality of fourth electrodes.

20. The display apparatus of claim 18, wherein the at least some of the plurality of first electrodes comprise a width substantially equal to a width associated with the at least some of the plurality of second electrodes, and wherein the at least some of the plurality of third electrodes comprise a width substantially equal to a width associated with the at least some of the plurality of fourth electrodes.

21. The display apparatus of claim 18, wherein ones of the plurality of first electrodes and ones of the plurality of second electrodes disposed relatively adjacent to a central axis associated with the plurality of lens parts comprise a greater width than a width associated with other ones of the plurality of first electrodes and other ones of the plurality of second electrodes disposed relatively farther from the central axis, and wherein ones of the plurality of third electrodes and ones of the plurality of fourth electrodes disposed relatively adjacent to the central axis comprise a greater width than a width associated with other ones of the plurality of third electrodes and other ones of the plurality of fourth electrodes disposed relatively farther from the central axis.

22. A method, comprising:
causing, at least in part, presentation of a left-eye image or a right-eye image; and
causing, at least in part, liquid crystal molecules to be spatially configured and variably aligned in association with either presentation of the left-eye image or presentation of the right-eye image, wherein spatial configuration and variable alignment of the liquid crystal molecules is configured to form one or more Fresnel lens parts,
wherein iterative presentation of the left-eye image and the right-eye image is configured to automatically convey the illusion of depth in association with a perceived image.

23. The method of claim 22, wherein causing, at least in part, presentation of the left-eye image or the right-eye image comprises:
causing, at least in part, the left-eye image or the right-eye image to be propagated through at least some of the one or more Fresnel lens parts.

24. The method of claim 22, wherein causing, at least in part, the liquid crystal molecules to be spatially configured and variably aligned comprises:
causing, at least in part, the liquid crystal molecules to be spatially configured and variably aligned to manipulate a central axis associated with the one or more Fresnel lens parts.

25. The method of claim 24, wherein the central axis is manipulated in a first direction in association with presentation of the left-eye image and manipulated in a second direction in association with presentation of the right-eye image.

26. The method of claim 25, wherein the first direction is associated with a first inclination angle and the second direction is associated with a second inclination angle, and wherein the second inclination angle is displaced by or about −180° from the first inclination angle.

27. The method of claim 22, further comprising:
determining a display mode associated with a display apparatus comprising at least a two-dimensional display mode and a three-dimensional display mode,
wherein the display mode associated with the presentation of the perceived image is the three-dimensional display mode and is configured to facilitate autostereoscopic presentation of one or more images.

28. The method of claim 22, wherein spatial configuration and variable alignment of the liquid crystal molecules is configured to form one or more concave Fresnel lens parts in association with presentation of one of the left-eye image or the right-eye image, and further configured to form one or more convex Fresnel lens parts in association with presentation of the other one of the left-eye image or the right-eye image.

29. An apparatus, comprising:
a display panel configured to present an image in association with a presentation surface; and
a variable lens panel disposed to receive source illumination from the display panel, the variable lens panel comprising liquid crystal molecules, the variable lens panel being configured to manipulate the liquid crystal molecules via imposition of a non-uniform electric flux to vary at least one refractive index associated with the liquid crystal molecules, the imposition of the non-uniform electric flux being configured to orient the liquid crystal molecules to form one or more Fresnel lens parts based on a plurality of operating modes associated with the variable lens panel,
wherein a three-dimensional image is selectively presented based on an operating mode associated with the apparatus and the plurality of operating modes associated with the variable lens panel.

30. The apparatus of claim 29, wherein the variable lens panel comprises:
a plurality of first electrodes; and
a plurality of second electrodes,
wherein ones of the plurality of first electrodes are alternated with ones of the plurality of second electrodes, and
wherein the plurality of first electrodes and the plurality of second electrodes are disposed on a first side of a layer comprising the liquid crystal molecules.

31. The apparatus according to claim 30, wherein the variable lens panel further comprises:
a plurality of third electrodes; and
a plurality of fourth electrodes,
wherein ones of the plurality of third electrodes are alternated with ones of the plurality of fourth electrodes, and
wherein the plurality of third electrodes and the plurality of fourth electrodes are disposed on a second side of the layer comprising the liquid crystal molecules.

32. The apparatus of claim 31, wherein respective widths of the electrodes associated with the corresponding pluralities of first, second, third, and fourth electrodes are the same.

33. The apparatus of claim 31, wherein respective widths of the electrodes associated with the corresponding pluralities of first, second, third, and fourth electrodes vary across the variable lens panel.

34. The apparatus of claim 31, wherein the plurality of first electrodes and the plurality of second electrodes are configured to impose the non-uniform electric flux to facilitate presentation of a first-eye image in association with a first one of the plurality of operating modes associated with the variable lens panel, and wherein the plurality of third electrodes and the plurality of fourth electrodes are configured to impose the non-uniform electric flux to facilitate presentation of a second-eye image in association with a second one of the plurality of operating modes.

35. The apparatus of claim 34, wherein the first one of the plurality of operating modes and the second one of the plurality of operating modes are iterated between in association with presentation of the three-dimensional image.

36. The apparatus of claim 29, wherein the variable lens panel is further configured to manipulate inclination of a central axis associated with the one or more Fresnel lens parts based on the plurality of operating modes associated with the variable lens panel.

37. The apparatus of claim 36, wherein the display panel comprises:
a plurality of pixels,
wherein at least one of the plurality of pixels comprises a width ($W_1$), the at least one pixel being separated from at least one other pixel by a distance ($W_2$),
wherein the variable lens panel is configured to manipulate the inclination of the central axis to at least one inclination angle ($\theta$), and
wherein the first width, the second width, and the at least one inclination angle satisfy the following:

$$W_2 < \tfrac{1}{2} W_1 * \cos \theta,$$

and $$W_2 < \tfrac{1}{2}(W_1 + W_2) * \cos \theta.$$

38. The apparatus of claim 29, wherein the apparatus is an autostereoscopic display apparatus.

* * * * *